(12) United States Patent
Takayama et al.

(10) Patent No.: US 9,178,182 B2
(45) Date of Patent: Nov. 3, 2015

(54) SEMICONDUCTOR DEVICE AND METHOD FOR MANUFACTURING THE SAME

(75) Inventors: Toru Takayama, Kanagawa (JP); Junya Maruyama, Kanagawa (JP); Yumiko Ohno, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

(21) Appl. No.: 13/248,302

(22) Filed: Sep. 29, 2011

(65) Prior Publication Data

US 2012/0018729 A1 Jan. 26, 2012

Related U.S. Application Data

(60) Division of application No. 12/266,589, filed on Nov. 7, 2008, now Pat. No. 8,044,397, which is a continuation of application No. 10/795,445, filed on Mar. 9, 2004, now Pat. No. 7,576,362.

(30) Foreign Application Priority Data

Mar. 14, 2003 (JP) .................................. 2003-069742

(51) Int. Cl.
*H01L 31/0203* (2014.01)
*H01L 51/56* (2006.01)
(Continued)

(52) U.S. Cl.
CPC ............ *H01L 51/56* (2013.01); *H01L 27/1214* (2013.01); *H01L 27/1266* (2013.01); *H01L 27/3244* (2013.01); *H01L 27/3276* (2013.01);
(Continued)

(58) Field of Classification Search
CPC .................. H01L 27/1214; H01L 2251/5338; H01L 29/41733; H01L 27/32; H01L 27/3251; H01L 51/0024; H01L 51/5012; H01L 51/5243; H01L 51/5246; H01L 27/3253
USPC .............................................. 257/59, E31.11
See application file for complete search history.

(56) References Cited

U.S. PATENT DOCUMENTS 5,206,749 A 4/1993 Zavracky et al.
5,317,236 A 5/1994 Zavracky et al.
(Continued)

FOREIGN PATENT DOCUMENTS

EP 0858110 A1 8/1998
EP 1017100 A1 7/2000
(Continued)

OTHER PUBLICATIONS

Itsuo Watanabe, et al.; "Anisotropic Conductive Films for Flat Panel Displays"; IDW '96; pp. 369-372; Nov. 27, 1996.
(Continued)

*Primary Examiner* — Wael Fahmy
*Assistant Examiner* — Sarah Salerno
(74) *Attorney, Agent, or Firm* — Fish & Richardson P.C.

(57) ABSTRACT

To realize a high-performance liquid crystal display device or light-emitting element using a plastic film. A CPU is formed over a first glass substrate and then, separated from the first substrate. A pixel portion having a light-emitting element is formed over a second glass substrate, and then, separated from the second substrate. The both are bonded to each other. Therefore, high integration can be achieved. Further, in this case, the separated layer including the CPU serves also as a sealing layer of the light-emitting element.

24 Claims, 9 Drawing Sheets

(51) Int. Cl.
*H01L 27/12* (2006.01)
*H01L 27/32* (2006.01)
*H01L 51/52* (2006.01)

(52) U.S. Cl.
CPC ... *H01L 51/5237* (2013.01); *H01L 2221/68368* (2013.01); *H01L 2227/326* (2013.01); *H01L 2251/5323* (2013.01)

(56) References Cited

U.S. PATENT DOCUMENTS

| | | | |
|---|---|---|---|
| 5,376,561 A | 12/1994 | Vu et al. | |
| 5,643,804 A | 7/1997 | Arai et al. | |
| 5,737,248 A | 4/1998 | Kawasaki et al. | |
| 5,757,456 A | 5/1998 | Yamazaki et al. | |
| 5,804,872 A | 9/1998 | Miyano et al. | |
| 5,821,138 A | 10/1998 | Yamazaki et al. | |
| 5,834,327 A | 11/1998 | Yamazaki et al. | |
| 5,861,666 A | 1/1999 | Bellaar | |
| 5,877,533 A | 3/1999 | Arai et al. | |
| 5,976,953 A | 11/1999 | Zavracky et al. | |
| 6,011,607 A | 1/2000 | Yamazaki et al. | |
| 6,027,958 A | 2/2000 | Vu et al. | |
| 6,043,800 A | 3/2000 | Spitzer et al. | |
| 6,118,502 A | 9/2000 | Yamazaki et al. | |
| 6,127,199 A | 10/2000 | Inoue et al. | |
| 6,133,626 A | 10/2000 | Hawke et al. | |
| 6,143,582 A | 11/2000 | Vu et al. | |
| 6,191,838 B1 | 2/2001 | Muramatsu | |
| 6,208,521 B1 | 3/2001 | Nakatsuka | |
| 6,242,758 B1 | 6/2001 | Yamazaki et al. | |
| 6,258,623 B1 | 7/2001 | Moden et al. | |
| 6,265,772 B1 | 7/2001 | Yoshida | |
| 6,312,304 B1 | 11/2001 | Duthaler et al. | |
| 6,372,608 B1 | 4/2002 | Shimoda et al. | |
| 6,376,333 B1 | 4/2002 | Yamazaki et al. | |
| 6,387,737 B1 | 5/2002 | Yamazaki et al. | |
| 6,388,652 B1 | 5/2002 | Yamazaki et al. | |
| 6,410,960 B1 | 6/2002 | Arai et al. | |
| 6,423,614 B1 | 7/2002 | Doyle | |
| 6,441,474 B2 | 8/2002 | Naitoh et al. | |
| 6,503,778 B1 | 1/2003 | Yamauchi et al. | |
| 6,506,681 B2 | 1/2003 | Grigg et al. | |
| 6,589,811 B2 | 7/2003 | Sayyah | |
| 6,590,346 B1 | 7/2003 | Hadley et al. | |
| 6,645,830 B2 | 11/2003 | Shimoda et al. | |
| 6,677,621 B2 | 1/2004 | Yamazaki et al. | |
| RE38,466 E | 3/2004 | Inoue et al. | |
| 6,737,300 B2 | 5/2004 | Ding et al. | |
| 6,780,677 B2 | 8/2004 | Imasu et al. | |
| 6,818,850 B2 | 11/2004 | Bridges | |
| 6,830,494 B1 | 12/2004 | Yamazaki et al. | |
| 6,844,673 B1 | 1/2005 | Bernkopf | |
| 6,846,703 B2 | 1/2005 | Shimoda et al. | |
| 6,883,934 B2 | 4/2005 | Kawakami et al. | |
| 6,946,361 B2 | 9/2005 | Takayama et al. | |
| 6,998,282 B1 | 2/2006 | Yamazaki et al. | |
| 7,037,752 B2 | 5/2006 | Kuwabara et al. | |
| 7,050,138 B1 | 5/2006 | Yamazaki et al. | |
| 7,056,810 B2 | 6/2006 | Yamazaki et al. | |
| 7,067,926 B2 | 6/2006 | Yamazaki et al. | |
| 7,094,665 B2 | 8/2006 | Shimoda et al. | |
| 7,164,151 B2 | 1/2007 | Yamazaki et al. | |
| 7,180,091 B2 | 2/2007 | Yamazaki et al. | |
| 7,214,555 B2 | 5/2007 | Yamazaki et al. | |
| 7,303,942 B2 | 12/2007 | Kuwabara et al. | |
| 7,442,957 B2 | 10/2008 | Yamazaki et al. | |
| 2001/0040298 A1 | 11/2001 | Baba et al. | |
| 2002/0016028 A1 | 2/2002 | Arao et al. | |
| 2002/0024096 A1 | 2/2002 | Yamazaki et al. | |
| 2002/0030189 A1* | 3/2002 | Ishikawa | 257/59 |
| 2002/0034930 A1* | 3/2002 | Yamazaki et al. | 455/90 |
| 2002/0041266 A1 | 4/2002 | Koyama et al. | |
| 2002/0055237 A1 | 5/2002 | Sayyah | |
| 2002/0100941 A1 | 8/2002 | Yonehara et al. | |
| 2002/0131007 A1 | 9/2002 | Yamazaki et al. | |
| 2002/0146893 A1 | 10/2002 | Shimoda et al. | |
| 2003/0024635 A1 | 2/2003 | Utsunomiya | |
| 2003/0025118 A1* | 2/2003 | Yamazaki et al. | 257/79 |
| 2003/0032210 A1 | 2/2003 | Takayama et al. | |
| 2003/0034497 A1* | 2/2003 | Yamazaki et al. | 257/86 |
| 2003/0047280 A1 | 3/2003 | Takayama et al. | |
| 2003/0047732 A1 | 3/2003 | Yamazaki et al. | |
| 2003/0057423 A1 | 3/2003 | Shimoda et al. | |
| 2003/0064569 A1 | 4/2003 | Takayama et al. | |
| 2003/0082889 A1 | 5/2003 | Maruyama et al. | |
| 2003/0122476 A1 | 7/2003 | Wang et al. | |
| 2003/0217805 A1 | 11/2003 | Takayama et al. | |
| 2003/0231263 A1 | 12/2003 | Kato et al. | |
| 2004/0046909 A1 | 3/2004 | Sekiguchi | |
| 2004/0087110 A1 | 5/2004 | Takayama et al. | |
| 2004/0121516 A1 | 6/2004 | Yamazaki et al. | |
| 2004/0124542 A1 | 7/2004 | Kuwabara et al. | |
| 2004/0140547 A1 | 7/2004 | Yamazaki et al. | |
| 2004/0189883 A1 | 9/2004 | Koyama | |
| 2004/0212012 A1 | 10/2004 | Yamazaki et al. | |
| 2004/0232413 A1 | 11/2004 | Yamazaki et al. | |
| 2004/0263712 A1 | 12/2004 | Yamazaki et al. | |
| 2005/0001211 A1* | 1/2005 | Yamazaki et al. | 257/52 |
| 2005/0051870 A1 | 3/2005 | Yamazaki et al. | |
| 2005/0056842 A1 | 3/2005 | Nishi et al. | |
| 2005/0070038 A1 | 3/2005 | Yamazaki et al. | |
| 2006/0030122 A1 | 2/2006 | Shimoda et al. | |
| 2007/0010067 A1 | 1/2007 | Shimoda et al. | |
| 2009/0108263 A1 | 4/2009 | Yamazaki et al. | |

FOREIGN PATENT DOCUMENTS

| | | |
|---|---|---|
| EP | 1229582 A1 | 8/2002 |
| EP | 1351308 A1 | 10/2003 |
| EP | 1603163 A1 | 12/2005 |
| EP | 1655633 A2 | 5/2006 |
| EP | 1744365 A2 | 1/2007 |
| EP | 1758169 A2 | 2/2007 |
| JP | 60-178424 A | 9/1985 |
| JP | 06-244360 A | 9/1994 |
| JP | 08-186156 A | 7/1996 |
| JP | 10-125929 A | 5/1998 |
| JP | 10-125930 A | 5/1998 |
| JP | 10-125931 A | 5/1998 |
| JP | 10-206894 A | 8/1998 |
| JP | 11-020360 A | 1/1999 |
| JP | 11-243209 A | 9/1999 |
| JP | 2000-004024 A | 1/2000 |
| JP | 2000-048952 A | 2/2000 |
| JP | 2000-061785 A | 2/2000 |
| JP | 2000-294723 A | 10/2000 |
| JP | 2001-331120 A | 11/2001 |
| JP | 2002-049359 A | 2/2002 |
| JP | 2002-189447 A | 7/2002 |
| JP | 2002-244576 A | 8/2002 |
| JP | 2003-045890 A | 2/2003 |
| JP | 3408154 A | 3/2003 |
| JP | 3408154 A | 5/2003 |

OTHER PUBLICATIONS

"Mass Production of Organic EL Devices"; Shimotsuke Newspaper; Jul. 3, 2003 (with translation).
"Two-Way Display Developed"; The Japan Times; Jul. 3, 2003.
Exhibition of Active Matrix Type Organic EL Display at "13" Flat Panel Display Manufacturing Technology Expo & Conference; Jul. 2, 2003 (with translation).
Documents Distributed in the "13th Flat Panel Display Manufacturing Technology Expo & Conference;" Jul. 2, 2003.
"Adhesive/adhere," www.m-w.com, Merriam-Webster Online Dictionary.
X. Zhang et al., "Thermal Conductivity and Diffusivity of Free-Standing Silicon Nitride Thin Films," Rev. Sci. Instrum. (Review of Scientific Instruments), Feb. 1, 1995, vol. 66, No. 2, pp. 1115-1120.
Itsuo Watanabe, et al.; "Anisotropic Conductive Films for Flat Panel Displays"; IDW '96; vol. 2; pp. 369-372; Nov. 27, 1996.

* cited by examiner

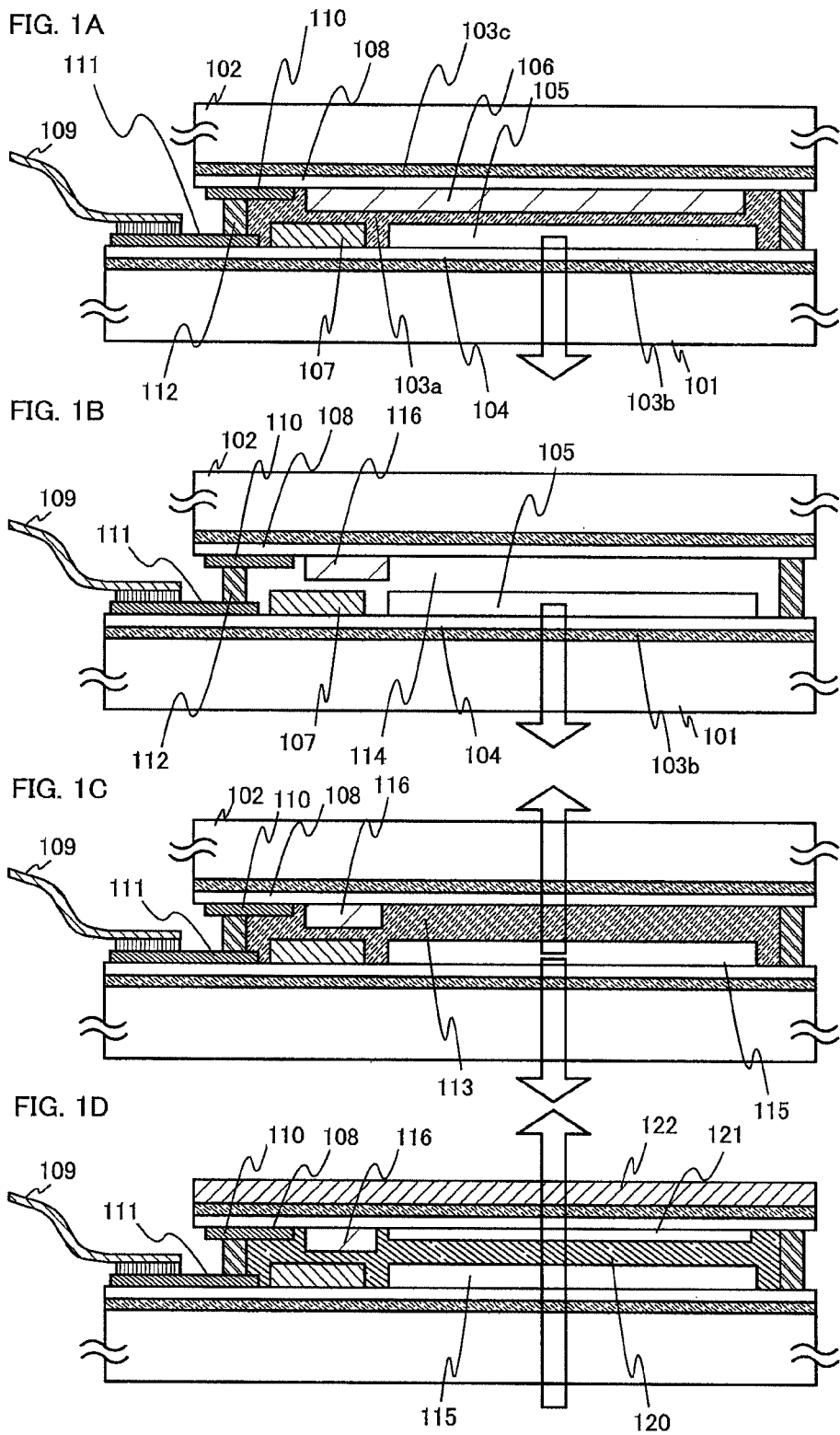

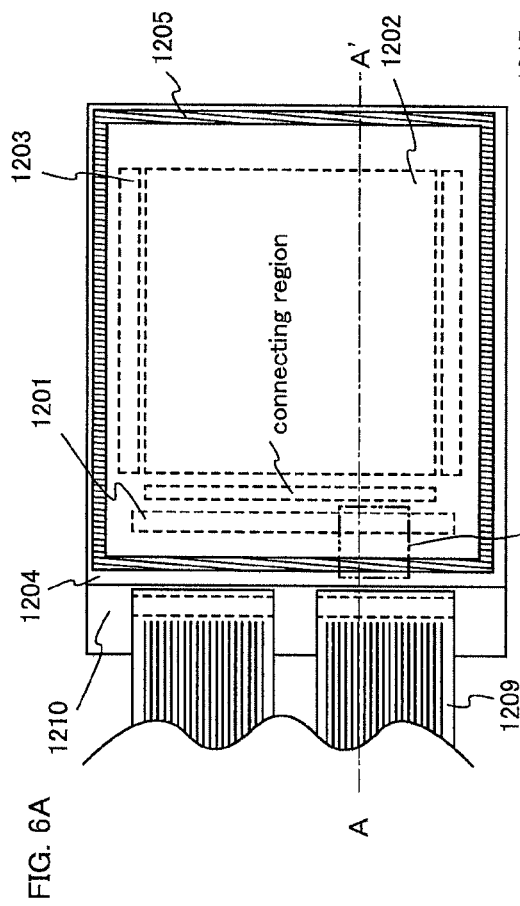
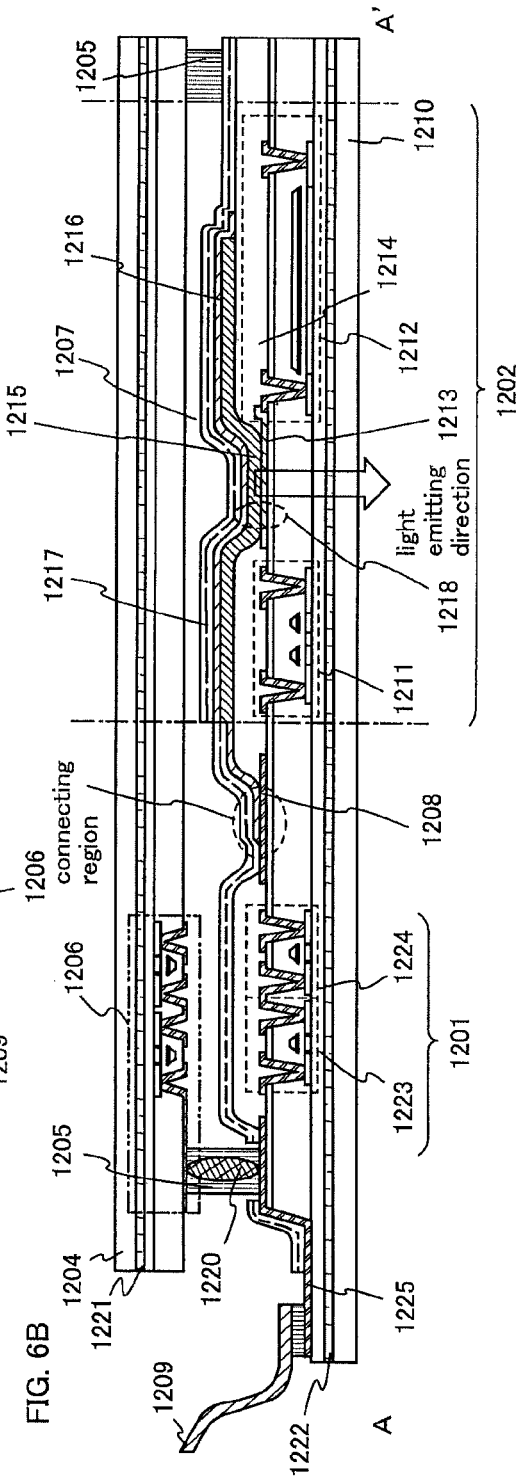
FIG. 6A
FIG. 6B

SEMICONDUCTOR DEVICE AND METHOD FOR MANUFACTURING THE SAME

CROSS-REFERENCE TO RELATED APPLICATIONS

This application is a divisional of U.S. application Ser. No. 12/266,589, filed Nov. 7, 2008, now allowed, which is a continuation of U.S. application Ser. No. 10/795,445, filed Mar. 9, 2004, now U.S. Pat. No. 7,576,362, which claims the benefit of a foreign priority application filed in Japan as Serial No. 2003-069742 on Mar. 14, 2003, all of which are incorporated by reference.

BACKGROUND OF THE INVENTION

1. Field of the Invention

The present invention relates to a semiconductor device having a circuit including thin film transistors (hereinafter, TFT) and a method for manufacturing the same. Specifically, the present invention relates to electronic devices incorporating an electro-optical device typified by a liquid crystal display panel, or a light emitting display device having an organic light emitting element, as a component. In addition, the present invention relates also to a semiconductor device having a circuit including thin film transistors which are formed by transferring and bonding a layer which has been separated by a separation method, to a substrate.

It should be noted that the term "a semiconductor device" in this specification denotes all kinds of devices that can function by utilizing semiconducting properties, and includes all of an electro-optical device, a semiconductor circuit, and electronics.

2. Description of the Related Art

In recent years, a technique for manufacturing a thin film transistor by using a semiconductor thin film (from several nm to several hundred nm in thickness) that is formed over a substrate having an insulating surface has attracted a lot of attention. Such a thin film transistor is applied to an electronic device such as an IC or an electro-optical device widely, and developed intensively as a switching element of a picture display device in particular.

Various applications using such a picture display device have been expected, and particularly, application to a portable device attracts attention. As a substrate for forming these TFTs, a glass substrate or a quartz substrate is widely used now, however, these substrates have some drawbacks such as being fragile and heavy. Further, these substrates are unsuitable for mass-production since it is difficult to use a large-sized glass substrate or a large-sized quartz substrate. Therefore it has been attempted that an element including TFTs is formed over a substrate having flexibility as typified by a flexible plastic film.

However, the maximum temperature of the process should be lowered since the heat resistance of a plastic film is low. As a result, it has been impossible to form a TFT having as good characteristics as that formed over a glass substrate. Thus, a high-performance liquid crystal display device or light emitting element using a plastic film has not been realized yet.

There has been proposed a method of separating from the substrate a layer to be separated that exists with a separation layer therebetween. For example, the technique stated in Patent Document 1 (Japanese Published Unexamined Application No. Hei 10-125929) is that a separation layer containing amorphous silicon (or, polysilicon) is provided, the amorphous silicon is irradiated with laser light through the substrate, to diffuse hydrogen included in the amorphous silicon, thereby producing a space to separate the substrate. In addition, in Patent Document 2 (Japanese Published Unexamined Application No. Hei 10-125930), a liquid crystal display device is completed by bonding a separated layer (a layer to be transferred in Patent Document 2) to a plastic film, by using the technique of Patent Document 1.

SUMMARY OF THE INVENTION

The present invention has been made in view of the above problems. It is an object of the present invention to make it possible to separate and transfer an element having high electric property and a circuit including the elements, by a separation method by which a layer to be separated is not damaged and by which a process of the layer to be separated is not limited.

When a light emitting device and a liquid crystal display device in which an organic light emitting device is formed over a substrate having flexibility such as a plastic film can be manufactured, the devices can be thinned and lightweight, and further can be applied to a display having a curved surface, a show window, or the like. Application of the devices is not limited to a portable device, and is extremely wide.

According to the present invention, a separation method is carried out as follows: when a metal layer is formed over a substrate and an oxide layer is laminated thereover, a metal oxide layer of the metal layer is formed in the interface of the metal layer and the oxide layer. Then, separation using the oxide metal layer is performed later.

Specifically, a tungsten film is formed by sputtering over a glass substrate, and a silicon oxide film is laminated by sputtering. When the silicon oxide film is formed by sputtering, a tungsten oxide layer in an amorphous state is formed. And an element such as a TFT is formed over the silicon oxide film. In the element formation process, the tungsten oxide layer is crystallized by a heat treatment of 400° C. or more. By physical force, separation occurs inside the tungsten oxide layer or in the interface thereof. The layer (including an element such as a TFT) that is separated in this way is transferred to a plastic substrate.

When circuits having different functions are formed over the same substrate, it is difficult to manufacture the circuits in the same process. When, for example, a pixel portion and a CPU are formed, a power supply voltage of the pixel portion for displaying (e.g., from 12 V to 16 V) and a power supply voltage of the CPU (e.g., 5 V) are different, it is difficult to manufacture the both over the same substrate. Accordingly, the steps get complex and the process yield is reduced.

According to the present invention, a plurality of separated layers having different elements are provided, and the layers are bonded and electrically connected to one another. An adhesive material including dispersed conductive particles, which are represented by carbon particles, silver particles, copper particles, or gold particles in an epoxy series adhesive material or a phenol series adhesive material, is used as an adhesive material for electrically connecting a plurality of separated layers. The adhesive material is patterned by a dispenser application method, offset printing or screen printing, and the layers are bonded to one another, and then baked.

For example, after forming a CPU over a first glass substrate, the CPU is separated from the first glass substrate. After forming a pixel portion having a light emitting element over a second glass substrate, the pixel portion is separated from the second glass substrate. Then, the CPU and the pixel portion are bonded to each other, thereby obtaining a highly integrated device. In this case, the separated layer including the CPU also serves as a sealing layer.

In the case of a bottom emission type light emitting device shown in FIG. 1A as an example, the CPU may be arranged to overlap with the pixel portion. Meanwhile, in the case of the top emission type light emitting device, or in the case of a dual emission type light emitting device shown in FIG. 1C, the CPU may be arranged not to overlap with the pixel portion.

In addition, a separated layer including a CPU is bonded to an optical film, typified by a color filter, as shown as an example in FIG. 1D, and the color filter is used as a support medium. The CPU is bonded to a portion except a portion functioning as the color filter, and the CPU bonded to the color filter is connected to wirings on the substrate side through conductive particles included in the adhesive material. An adhesive material including dispersed conductive particles represented by carbon particles, silver particles, copper particles, or gold particles dispersedly in an epoxy series adhesive material or a phenol series adhesive material, is used as the adhesive material for electrically connecting a plurality of separated layers. The adhesive material is patterned by a dispenser application method, offset printing or screen printing, and the layers are bonded to one another, and then baked.

In the case of the bottom emission type light emitting device, the adhesive material for bonding the sealing layer may have the same heat radiation effect as a mould resin covering the CPU.

A configuration disclosed in the present invention is a semiconductor device including: a substrate provided with a light emitting element, and a sealing plate provided with a semiconductor integrated circuit, wherein the substrate containing an organic resin material is bonded to the sealing plate containing an organic resin material with a first adhesive layer therebetween, a second adhesive layer is formed between the light emitting element and the substrate, a third adhesive layer is formed between the semiconductor integrated circuit and the sealing plate, and a terminal electrode of the semiconductor integrated circuit is electrically connected to a terminal electrode over the substrate through conductive particles.

Another configuration is a semiconductor device including: a substrate provided with a pixel portion including a light emitting element and a driver circuit portion, and a sealing plate provided with a semiconductor integrated circuit, wherein the substrate containing an organic resin material is bonded to the sealing plate containing an organic resin material with a first adhesive layer therebetween, a second adhesive layer is formed between the light emitting element and the substrate, a third adhesive layer is formed between the semiconductor integrated circuit and the sealing plate, and a display is performed by making light from the light emitting element pass through the substrate.

In the above configuration, the semiconductor integrated circuit is partially overlapped with the driver circuit portion or the pixel portion.

Another configuration is a semiconductor device including: a substrate provided with a pixel portion including a light emitting element and a driver circuit portion, and a sealing plate provided with a semiconductor integrated circuit, wherein the substrate containing an organic resin material is bonded to the sealing plate containing an organic resin material with a first adhesive layer therebetween, a second adhesive layer is formed between the light emitting element and the substrate, a third adhesive layer is formed between the semiconductor integrated circuit and the sealing plate, and a display is performed by making light from the light emitting element pass through the sealing plate.

In the above configuration, a space between the substrate and the sealing plate is kept with a gap material such as fiber included in a sealing material, and a region surrounded by the sealing material is filled with the first adhesive layer or is filled with an inert gas and includes a desiccant therein.

In the above configuration, the semiconductor integrated circuit includes a central processing unit including a control unit and an arithmetic unit, and a memory unit, and the central processing unit includes a plurality of thin film transistors.

In the above configuration, the semiconductor integrated circuit includes at least a central processing unit including a control unit and an arithmetic unit, and a memory unit, and the sealing plate includes a memory element, a thin film diode, a silicon-based PIN junction photoelectric conversion element, a silicon resistance element, besides the central processing unit. As described above, it is effective particularly for the case where a power supply voltage of a display portion for displaying is different from a power supply voltage of a semiconductor integrated circuit (typically, a CPU) that a separation step and a transfer step are performed in different steps and the resultant products are bonded to each other, instead of forming them in the same process.

In the above configuration, the sealing plate is a film where a low-melting metal and ceramics are mixed into a synthetic resin containing polypropylene, polypropylene sulfide, polycarbonate, polyether imide, polyphenylene sulfide, polyphenylene oxide, polysulfone, or polyphtal amide.

A configuration of the present invention for realizing the above structures is a method for manufacturing a semiconductor device, including the steps of: forming a layer to be separated including a semiconductor integrated circuit over a first substrate, separating the layer to be separated including the semiconductor integrated circuit from the first substrate, transferring the separated layer including the semiconductor integrated circuit to a second substrate, forming a layer to be separated including a display portion over a third substrate, separating the layer to be separated including the display portion from the third substrate, transferring the separated layer including the display portion to a fourth substrate, and bonding the separated layer including the semiconductor integrated circuit to the separated layer including the display portion to obtain an assembly of the separated layers.

In the above configuration, the step of separating the layer to be separated including the semiconductor integrated circuit from the first substrate, and transferring to the second substrate, includes the steps of: applying an organic resin film that is soluble in a solvent, over the layer to be separated, sandwiching the layer to be separated and an organic resin film with the first substrate and a fifth substrate by bonding the fifth substrate to the organic resin film by a first two-sided tape, bonding a sixth substrate to the first substrate by a second two-sided tape, separating the first substrate to which the sixth substrate is bonded, from the layer to be separated by a physical means, sandwiching the separated layer with the fifth substrate and the second substrate by bonding the second substrate to the separated layer by a first adhesive material, separating the fifth substrate from the separated layer and the first two-sided tape, separating the first two-sided tape from the separated layer, and removing the organic resin film by a solvent.

In the above configuration about the method of manufacturing, the solvent is water or alcohol.

In the above configuration about the method of manufacturing, the first substrate is a glass substrate, and the fifth substrate and the sixth substrate are a quartz substrate or a metal substrate.

In the above structures about the method of manufacturing, the second substrate and the fourth substrate are plastic substrates.

Note that, a light emitting element (an EL element) includes a layer containing an organic compound that emits light by applying an electric field (hereinafter, an EL layer), an anode, and a cathode. Luminescence generated by an organic compound are fluorescence that generates upon returning of electrons from the singlet excited state to the ground state and phosphorescence that generates upon returning of electrons from the triplet excited state to the ground state. A light emitting device manufactured according to the present invention can employ the both luminescence.

The light emitting element (EL element) including an EL layer has a structure in which a pair of electrodes sandwich the EL layer therebetween, and the EL layer, generally, has a laminated structure. Typically, a laminated structure laminating a hole transporting layer, a light emitting layer, an electron transporting layer in this order is known. The structure provides greatly high luminous efficiency and is used in almost all light emitting devices that are under research and development now.

Another structure including an anode, a hole injecting layer, a hole transporting layer, a light emitting layer, and an electron transporting layer in this order or including an anode, a hole injecting layer, a hole transporting layer, a light emitting layer, an electron transporting layer, and an electron injecting layer in this order is also applicable. Fluorescent pigments or the like can be doped to the light emitting layer. Either a low molecular weight material or a high molecular weight material can be used for forming these layers. In addition, an organic compound layer including an inorganic material may be employed. In this specification, an EL layer is a generic term used to refer to all layers formed between a cathode and an anode. Therefore, all of the above-mentioned hole injecting layer, hole transporting layer, light emitting layer, electron transporting layer, and electron injecting layer are included in an EL layer.

Further, there are no particular limitations placed on a method for driving a screen display in the light emitting device of the present invention. For example, a dot sequential driving method, a line sequential driving method, a surface sequential driving method, or the like may be used. A line sequential driving method is typically used, and a time division gray scale driving method or a surface area gray scale driving method may also be appropriately employed. Further, image signals input to a source line of the light emitting device may be either analog signals or digital signals. Driving circuits and the like may be appropriately designed according to the image signals.

The present invention can be applied to a passive matrix light emitting device as well as an active matrix light emitting device.

The present invention can be applied to a liquid crystal display device, and a structure is that a semiconductor device, wherein a substrate provided with a pixel TFT and a pixel electrode is bonded to an optical film provided with an opposite electrode and a semiconductor integrated circuit, a liquid crystal material is filled between the substrate containing an organic resin material and the optical film containing an organic resin material, a second adhesive layer is formed between the pixel TFT and the substrate, a third adhesive layer is formed between the semiconductor integrated circuit and the optical film, and a terminal electrode of the semiconductor integrated circuit is electrically connected to a terminal electrode over the substrate by conductive particles.

The present invention also provides a method for laminating separated layers obtained by the separation method and for electrically connecting terminals that are provided for each of the separated layers.

According to the present invention, edge faces of the separated layers are disposed so that each terminal electrode thereof may be arranged in a staircase pattern, and fixed. The separated layers are laminated to expose terminals thereof.

Complicated steps are required to connect the separated layers. For example, when three separated layers are overlapped with one another, and a terminal electrode is provided for a surface of a first separated layer, it is necessary to provide terminals for the both front side and back side of a second separated layer and to electrically connect the terminals.

According to the present invention, when three separated layers are overlapped, terminal electrodes are provided for the surface of the first separated layer, the surface of the second separated layer, and the surface of the third separated layer, respectively, as an example shown in FIG. 7A, and positions of the terminal electrodes are disposed not to be overlapped with one another, and the separated layers are bonded together. An anisotropic conductive film is bonded thereover in a staircase pattern, and further, an FPC is bonded to be in contact with the film to make an electrical connection with the terminal electrodes of the separated layers. It should be noted that the anisotropic conductive film of this specification is a film in which conductive particles are mixed into a thermosetting or thermoplastic resin film, also referred to as an ACF (anisotropic conductive film). A two-layer ACF or a three layer ACF may be employed. When the anisotropic conductive film is bonded to the assembly of the separated layers, steps are formed. The FPC is bonded to be in contact with the steps, and the FPC has also a staircase pattern.

Alternatively, wirings (metal foil) that fit terminal pitch may be provided on the surface of anisotropic conductive film, in this case, an FPC may be bonded, in accordance with the wirings on the surface of the anisotropic conductive film and the FPC is not required to be made in a staircase pattern.

Since the thickness of the separated layer obtained according to the present invention is thin (approximately 1.5 μm), the step difference between the separated layers is small, and conduction can be obtained by bonding the anisotropic film or the FPC in a staircase pattern by thermocompression in this way. Particularly, when terminals of common wirings such as a ground wiring and a power supply wiring are arranged linearly, only one wiring of the FPC side or the anisotropic conductive film side is needed, thereby reducing the number of wirings. Alternatively, the conduction may be performed only among the separated layers that are laminated. According to the present invention, various electrical connections between layers, between exposed electrodes, and the like are performed only by bonding the anisotropic conductive film and the FPC. Thus, steps of electrical connection can be reduced and the process yield can be enhanced.

A configuration of the present invention by the above described connection is a semiconductor device, which is an assembly of semiconductor integrated circuits that are formed by overlapping and bonding a plurality of layers including a semiconductor element, wherein each layer including the semiconductor element has a terminal electrode on a surface thereof, the layers including the semiconductor element are arranged in a staircase pattern in such a way that edge faces thereof are exposed, and bonded, and one anisotropic conductive film is bonded in a staircase pattern in accordance with the terminal electrode and the edge faces.

In the above configuration, the anisotropic conductive film or an FPC having a staircase pattern is bonded to be in contact with all of the terminal electrodes, and a wiring provided for the anisotropic conductive film or a wiring provided for the FPC is electrically connected to the terminal electrode.

In the above configuration, the layer including the semiconductor element is a layer that is separated from a glass substrate or a quartz substrate by a separation method.

Another configuration of the present invention by the above described connection is a semiconductor device including a light emitting element that has a layer containing an organic compound as a light emitting layer, and a semiconductor element, wherein one layer of an inorganic insulating film is included as a sealing layer of the light emitting element that has the layer containing the organic compound as the light emitting layer, and a layer including the semiconductor element is bonded thereto by an adhesive agent.

In the above configuration, the layer including one inorganic insulating layer and the semiconductor element is a layer that is separated from a glass substrate or a quartz substrate by the separation method.

In the above structure, the inorganic insulating film is a silicon nitride film or a silicon oxynitride film.

According to the present invention, a layer including a CPU is bonded to a sealing plate containing plastic, thereby achieving a higher integration. Further, the CPU provided for the sealing plate can be mounted at the same time when an active matrix substrate and the sealing plate are bonded together with each other, and thus steps of mounting can be reduced.

A support medium of the present invention can be more inexpensive, flexible, and light-weight.

These and other objects, features and advantages of the present invention become more apparent upon reading of the following detailed description along with the accompanying drawings.

BRIEF DESCRIPTION OF THE DRAWINGS

In the accompanying drawings:
FIGS. 1A to 1D show cross-sectional structures of the present invention, respectively (Embodiment Mode 1);
FIGS. 6A and 6B show a top view and a cross sectional view of a semiconductor device, respectively (Embodiment 1)

DETAILED DESCRIPTION OF THE INVENTION

Figure 2A:
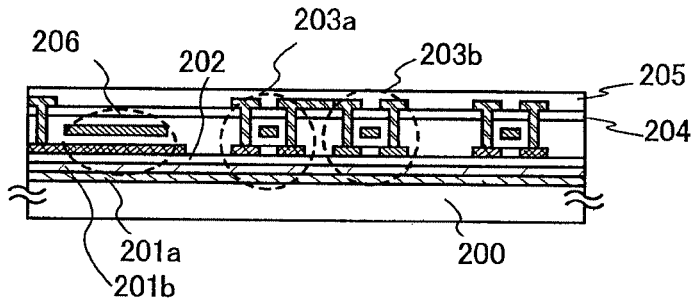
FIGS. 2A to 2E show manufacturing steps, respectively (Embodiment 1)

Embodiment modes of the present invention are described hereinafter.

Embodiment Mode 1

Here, a separation method using a metal film and a silicon oxide film is employed. According to the present invention, an assembly of separated layers is formed by bonding a plurality of the separated layers obtained by a separation method.

A semiconductor integrated circuit (here, CPU) 106, an insulating layer 108, and a layer to be separated (a first layer to be separated) including a terminal electrode 111 are formed over a first substrate. The first layer to be separated includes a silicon nitride film serving as a blocking layer. A protective film or a gate insulating film may be formed from the silicon nitride film. The blocking layer is provided to prevent impurities (such as oxygen and moisture) from diffusing and entering from the outside.

The CPU includes an n-channel TFT, a p-channel TFT, a CMOS circuit combining the both complementary, and a capacitor.

The first layer to be separated is separated from the first substrate, and transferred to a first plastic substrate 102 with a third adhesive layer 103c therebetween. In this stage, a sealing plate is completed. A terminal electrode 110 that is an end portion of a wiring extending from the CPU is exposed.

After a layer to be separated (a second layer to be separated) including an insulating film 104, TFTs is arranged in matrix, and one electrode of a light emitting element which connect with the TFTs is formed over a second substrate, the second layer to be separated is separated from the second substrate, and transferred to a second plastic substrate 101 with an adhesive layer 103b therebetween. Thereafter, a light emitting layer and the other electrode of the light emitting element are formed to complete the light emitting element. In this stage, a pixel portion 105 having the light emitting element is completed. In addition, a driver circuit 107 may be formed in the same step as the TFTs arranged in matrix. A terminal electrode 111 that is an end portion of a wiring extending from the pixel portion or the driver circuit is exposed.

Subsequently, the first plastic substrate and the second plastic substrate are bonded together with an adhesive material 112 (a sealing material) including conductive particles so that the terminal electrodes which are provided for the first plastic substrate and the second plastic substrate, respectively can be overlapped with each other. An anisotropic conductive film (ACF) and a solder may be used instead of the adhesive material including conductive particles. Conduction among the terminal electrodes that are provided for the different substrates can be obtained by using the conductive particles. The sealing material is preferably applied so as to surround the pixel portion 105, and a space between the pair of the substrates is preferably filled with an adhesive material 103a (a first adhesive layer) having lower viscosity than that of the sealing material. It is desirable in the reliability of the light emitting element to employ a material that can prevent penetration of oxygen and moisture as the adhesive material to fill the inside. Further, heat radiation of the semiconductor integrated circuit or the light emitting element can be performed when a material having high heat conduction is used for the adhesive material 103a.

According to the present invention, sealing of the light emitting element and mounting of a semiconductor integrated circuit can be performed at the same time.

In the case of a display device in which the light emitting direction of the light emitting element is a direction shown by an arrow in FIG. 1A, in such a way that light of the light emitting element passes through the second plastic substrate 101 (bottom emission type), there is no adverse effect of displaying when the semiconductor integrated circuit 106 is overlapped with the pixel portion 105. Reference numeral 109 denotes an FPC in FIG. 1A.

A space 114 between the pair of substrates is shown in a structure of FIG. 1B. Here, a semiconductor integrated circuit 116 has a small size, but may have a size for partially overlapping with a portion of the pixel portion. Further, a desiccant for capturing moisture in the space, or a deoxidant for capturing oxygen may be disposed in the space 114. The same elements as those in FIG. 1A are denoted by the same reference numerals as those in FIG. 1A.

As shown in FIG. 1C, in the case of a display device in which the light emitting directions of the light emitting element are directions shown by arrows in FIG. 1C, in such a way that light of the light emitting element passes through the first plastic substrate 101 and the second plastic substrate 102 (dual emission type), the semiconductor integrated circuit 116 is arranged so as not to overlap with a pixel portion 115. An adhesive material 113 to fill a space of the pair of substrates is preferably made of a transparent material. The same elements as those in FIG. 1A are denoted by the same reference numeral as those in FIG. 1A.

The present invention can be applied to a passive matrix light emitting device as well as an active matrix light emitting device.

The present invention is useful for a liquid crystal display device as well as a light emitting element. Instead of the first plastic substrate, an optical film (such as a polarization film or a phase difference film) 122, for example, a color filter is used. In the color filter, colored layers of red, blue, and green are arranged in accordance with a pixel, a black light-shielding layer is provided for the space therebetween. The semiconductor integrated circuit 116 is arranged in portions other than the colored layers and the black light-shielding layer. As shown in FIG. 1D, an opposite electrode 121 is formed together with the semiconductor integrated circuit 116, and a separation step and a transfer step are performed to provide a color filter. At this time, the optical film 122 serves as an opposite substrate and holds a liquid crystal material 120. It is noted that an orientation film (not shown) is provided to be in contact with the liquid crystal material 120. When bonding the color filter, alignment of the color filter is performed, and alignment of the terminal electrodes also can be performed at the same time. The same elements as those in FIG. 1A. are denoted by the same reference numeral as those in FIG. 1A.

Embodiment Mode 2

In this embodiment mode, an example of forming a layer to be separated including a memory or a central processing unit (referred to as a CPU) over a substrate (typically, a glass substrate, a quartz substrate) having an insulating surface, and then transferring to a plastic substrate is described with reference to FIG. 4 and FIGS. 5A and 5B.

Figure 4:
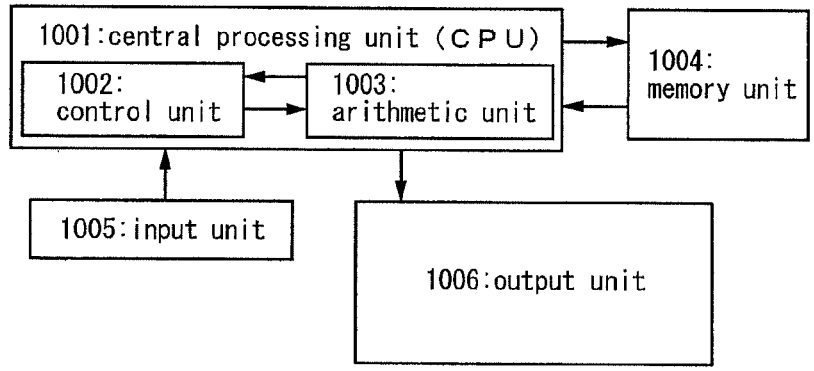
FIG. 4 is a block-diagram of a CPU (Embodiment Mode 2)

In FIG. 4, reference numeral 1001 denotes a central processing unit (CPU), 1002 denotes a control unit, 1003 denotes an arithmetic unit, 1004 denotes a memory unit (referred to as a memory), 1005 denotes an input unit, and 1006 denotes an output unit (such as a display portion).

The central processing unit 1001 includes the control unit 1002 and the arithmetic unit 1003. The arithmetic unit 1003 comprises an arithmetic logic unit (ALU) for performing arithmetic operations such as addition and subtraction, or logical operations such as AND, OR, and NOT, various registers for temporarily storing data or results of the operations, a counter for counting the number of 1 that are inputted, and the like. Circuits of the control unit 1003, such as an AND circuit, an OR circuit, a NOT circuit, a buffer circuit, a resistor circuit can be formed from TFTs. For the sake of obtaining a high field effect mobility, a semiconductor film that has been crystallized by laser light of a continuous wave laser may be formed as an active layer of the TFT.

A tungsten film and a silicon oxide film are formed over a substrate by sputtering, then a base insulating film (a silicon oxide film, a silicon nitride film, or a silicon oxynitride film) is formed thereover, and then an amorphous silicon film is formed thereover. In a later step, separation is performed by using a tungsten oxide layer formed in the interface between the tungsten film and the silicon oxide film.

Crystallization methods for obtaining a polysilicon film are given as follows: a method of adding a metal element serving as a catalyst to the amorphous silicon film, heating the film to obtain a polysilicon film and obtaining a more crystallized polysilicon film by irradiating with laser light of a pulsed laser; a method of emitting laser light of a continuous wave laser on the amorphous silicon film to obtain a polysilicon film; a method of heating the amorphous silicon film to obtain a polysilicon film and irradiating the polysilicon film with laser light of a continuous wave laser to obtain a more crystallized polysilicon film; or a method of adding a metal element serving as a catalyst to the amorphous silicon film, heating the film to obtain a polysilicon film and obtaining a more crystallized polysilicon film by irradiating with laser light of a continuous wave laser. In the case of using a continuous wave laser, the direction of a channel length of a TFT constituting the arithmetic unit 1003, the control unit 1002 or the memory unit 1004 is the same as a scanning direction of laser light.

The control unit 1002 has a function of executing an instruction stored in the memory unit 1004 and controlling the whole operation. The control unit 1002 includes a program counter, an instruction register, and a control signal generating unit. The control unit 1002 can be formed from TFTs and a crystallized semiconductor films are used as active layers of the TFTs.

The memory unit 1004 is a unit for storing data and instructions for performing operations. Data or programs that are often executed in the CPU are stored in the memory unit 1004. The memory unit 1004 includes a main memory, an address register, and a data register. A cache memory may be used in addition to the main memory. These memories may include SRAM, DRAM, a flash memory, or the like. When the memory unit 1004 is formed from TFTs, a crystallized semiconductor film is used as active layers of the TFTs.

The input unit 1005 is a device for receiving data or program from the outside. The output unit 1006 is a device for displaying results, typically, a display device.

The direction of the channel length of the TFT is the same as a scanning direction of laser light, thereby making it possible to manufacture a CPU having less variation of characteristic over an insulating substrate.

A layer to be separated including the thus obtained CPU (including a terminal electrode 1015 and leading wirings) is separated from the substrate and transferred to a plastic substrate 1016.

Similarly, a layer to be separated including a display portion 1011 and a driver circuit portion 1013 is formed over a substrate, and then, separated from the substrate, and transferred to a plastic substrate 1010. A leading wiring from the driver circuit portion 1013, a terminal electrode 1014a and a terminal electrode 1014b for electrically connecting to a terminal electrode 1015 of the CPU are provided.

The separated layer including the CPU, the separated layer including the display portion 1011 and the driver circuit portion 1013 are bonded together by an adhesive material 1014. Thus, a semiconductor device including the assembly of the separated layers can be completed.

Figure 5A:
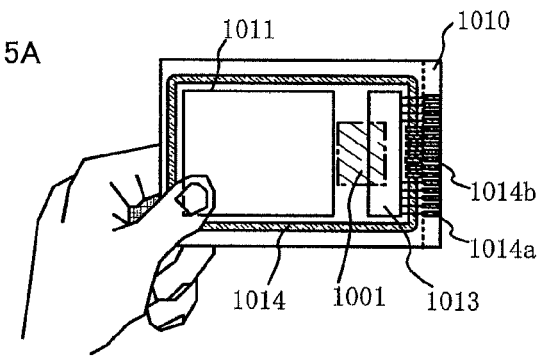
FIGS. 5A and 5B show a display side and a backside, respectively (Embodiment Mode 2)
Figure 5B:
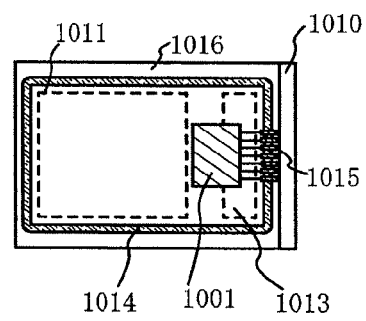

FIGS. 5A and 5B show a state in which the separated layers are bonded together. FIG. 5A shows a display surface side and an example of display that is performed by making light pass through the plastic substrate 1010 provided with the driver circuit. FIG. 5B shows a backside and a mode of the plastic substrate 1016 provided with the CPU.

The CPU and the terminal electrode 1014b are electrically connected with each other via the conductive particles included in the adhesive material 1014. The display portion 1011 is sealed with the plastic substrate 1016 and the adhesive material 1014, thereby preventing impurities from entering from the outside.

A region surrounded by the adhesive material 1014 may be filled with an organic resin.

A protective film including a silicon nitride film is provided for the whole surface of the substrate to cover the CPU, and thus, the whole surface can neatly be separated in the separation step. This silicon nitride film can serve as a barrier film.

Here, the example of display that is performed by making light pass through the plastic substrate 1010 is shown, but the present invention can be applied to the case of display that is performed by making light passing through the plastic substrate 1016. Further, the present invention can be also applied to the case of display that is performed by making light pass through both the plastic substrate 1010 and the plastic substrate 1016.

Embodiment Mode 3

Here, an electrical connection method of the present invention is described with reference to FIGS. 7A and 7B.

According to Embodiment Mode 1, a first terminal electrode 711a, a driver circuit portion 707, and a pixel portion 705 are formed over a resin substrate 701. Specifically, a tungsten film and a silicon oxide film (a layer of an insulating layer 704) are formed over a glass substrate by sputtering, and a base insulating film, the first terminal electrode 711a, TFTs (the pixel portion and the driver circuit portion), an anode, and a partition wall are sequentially formed thereover, and then, a quartz substrate is bonded to separate the glass substrate. The insulating layer 704 that has been separated is bonded to the resin substrate 701 with a first adhesive layer 703a therebetween. Then, the quartz substrate is removed. A layer containing an organic compound and a cathode are formed over the anode to manufacture a light emitting element, and the pixel portion 705 is formed by being covered with a protective film.

Similarly, a tungsten film and an silicon oxide film (a layer of an insulating layer 700) are formed over a glass substrate by sputtering, and a base insulating film, a second terminal electrode 711b, a first semiconductor integrated circuit 706 (such as a memory) are formed thereover, and then, a quartz substrate is bonded to separate the glass substrate. The insulating layer 700 that has been separated is bonded so as to cover the pixel portion provided for the resin substrate 701 with a second adhesive layer 703b and a sealing material 702 therebetween. Then, the quartz substrate is removed. When the second adhesive layer 703b is used to bond, edge faces are disposed to expose at least a portion of the first terminal electrode 711a. Further, the insulating layer 700 includes at least either a silicon nitride film or a silicon oxynitride film, and thus, the film can have an effect of a blocking layer.

Similarly, a tungsten film and a silicon oxide film (a layer of an insulating layer 708) are formed over a glass substrate by sputtering, and a base insulating film, a third terminal electrode 711c, a second semiconductor integrated circuit 709 (such as a CPU) are formed thereover, and then, a quartz substrate is bonded to separate the glass substrate. The insulating layer 708 that has been separated is bonded so as to cover the memory with a third adhesive layer 703c therebetween. Then, the quartz substrate is removed. When the third adhesive layer 703c is used to bond, edge faces are disposed to expose a portion of the second terminal electrode 711b. Further, the insulating layer 708 includes at least either a silicon nitride film or a silicon oxynitride film, and thus, the film can have an effect of a blocking layer.

Figure 7A:
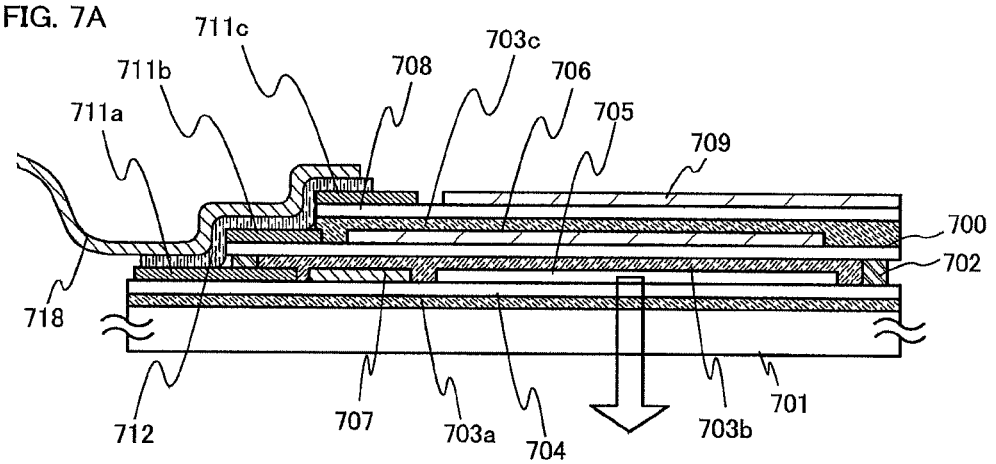
FIGS. 7A and 7B are cross-sectional views of a semiconductor device, (Embodiment Mode 3)

According to the above-described steps, as shown in FIG. 7A, three separated layers are overlapped over the resin substrate 701 to obtain a structure in which the terminal electrodes 711a to 711c are arranged in a staircase pattern.

Lastly, an anisotropic conductive film 712 is bonded to the terminal electrodes 711a to 711c to perform thermocompression on an FPC 718. As shown in FIG. 7A, since the terminal electrodes 711a to 711c are arranged in a staircase pattern, the anisotropic conductive film 712 has also a staircase pattern in accordance with the step differences of the terminal electrodes. In addition, a wiring pattern (e.g., aluminum foil) may be formed on a surface of the anisotropic conductive film 712 to electrically connect with each of the terminal electrodes bonded to the backside face.

The light emitting direction in FIG. 7A is a direction for making light pass through the resin substrate. The semiconductor integrated circuit also can serve as a light-shielding film. When a metal material that cannot transmit light is used as the cathode or the anode of the light emitting element, the cathode or the anode of the light emitting element can function also as a light-shielding film to protect the semiconductor integrated circuit from outside light.

A semiconductor integrated circuit such as a CPU generating much heat is preferably arranged in a top layer to easily radiate the heat.

FIG. 7A shows a structure in which a separation step and a transfer step are performed three times, respectively. However, the present invention is not limited to the three-layer structure, and may adopt a structure shown in FIG. 7B.

Figure 7B:
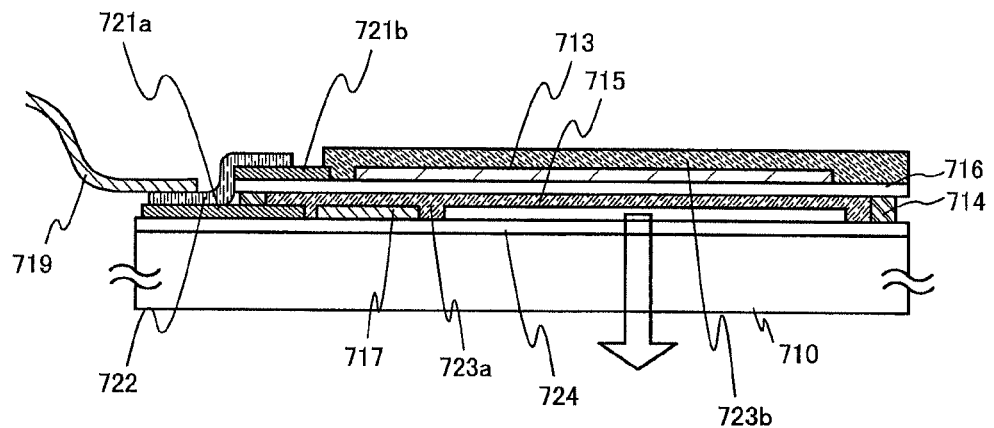

In FIG. 7B, a semiconductor integrated circuit 713 is bonded by performing a separation step and a transfer step once, in order to seal a pixel portion 715 formed over a substrate 710 that is a glass substrate, a quartz substrate, or the like.

A first terminal electrode 721a, a driver circuit portion 717, and a pixel portion 715 are formed over the substrate 710 by a known technique. Specifically, a base insulating film 724, the first terminal electrode 721a, TFTs (a pixel portion and a driver circuit portion), an anode, a partition wall, a layer containing an organic compound, and a cathode are sequentially formed.

According to Embodiment Mode 1, a tungsten film and a silicon oxide film (a layer of an insulating layer 716) are formed over the glass substrate by sputtering, and the base insulating film, a second terminal electrode 721b, a semiconductor integrated circuit 713 including TFTs (such as a memory or a CPU) are formed thereover, and then, a quartz substrate is bonded with a second adhesive layer 723b therebetween to separate the glass substrate. The insulating layer 716 that has been separated is bonded so as to cover the pixel portion provided for the substrate 710 with a first adhesive layer 723a therebetween and by a sealing material 714. Then, the quartz substrate is removed. When the first adhesive layer 723a is used to bond, edge faces are disposed to expose even a portion of the first terminal electrode 721a. Further, the insulating layer 716 includes at least either a silicon nitride film or a silicon oxynitride film, and thus, the film can have an effect of a blocking layer.

According to the above-described steps, as shown in FIG. 7B, a structure in which a separated layer is overlapped over the substrate 710, and the terminal electrodes 721a and 721b are arranged in a staircase pattern.

Lastly, an anisotropic conductive film 722 is bonded to the terminal electrodes 721a and 721b a thermocompression of an FPC 719 thereon is performed. As shown in FIG. 7B since the terminal electrodes 721a and 721b are arranged in a staircase pattern, the anisotropic conductive film 722 has also a staircase pattern in accordance with the step differences of the terminal electrodes. In addition, a wiring pattern (e.g., aluminum foil) is formed on a surface of the anisotropic conductive film 722 to electrically connect with each of the terminal electrodes bonded to the backside face. Here, it is not required to provide the FPC 719 with a staircase pattern, since the wiring pattern (not shown) is formed on the surface of the anisotropic conductive film 722.

This embodiment mode can be freely combined with Embodiment Modes 1 or 2.

The present invention having the above described structures is described in detail in embodiments that is described hereinafter.

EMBODIMENTS

Embodiment 1

This embodiment shows an example of manufacturing an assembly of separated layers by the plurality of separated layers obtained by a separation technique and a transfer technique.

Here, a separation method using a metal film and a silicon oxide film is adopted.

An element is formed over a glass substrate (a first substrate 200). In this embodiment, AN100 is used as the glass substrate. A metal film 201a is formed, here, a tungsten film is formed as the metal film 201a to have a thickness of from 10 nm to 200 nm, preferably, from 50 nm to 75 nm by sputtering over the glass substrate. Further, an oxide film 202, a silicon oxide film in this instance, is laminated to have a thickness of from 150 nm to 200 nm without being exposed to the air. The oxide film 202 is preferably twice as thick as the metal film or more. It should be noted that a 2-nm to 5-nm-thick metal oxide film (a tungsten oxide film) in amorphous state is formed between the metal film 201a and the silicon oxide film 202 in laminating the silicon oxide film. Separation occurs inside the tungsten oxide film, in the interface between the tungsten oxide film and the silicon oxide film, or the interface between the tungsten oxide film and the tungsten film in a later separation step. As materials for the metal layer, an element selected from the group consisting of Ti, Ta, Mo, Nd, Ni, Co, Zr, Zn, Ru, Rh, Pd, Os, Ir, and Pt; a single layer containing an alloy material or a compound material, each of which contains these elements as their main components; a lamination layer of the single layers; or nitrides, for example, a single layer or a lamination layer formed from titanium nitride, tungsten nitride, tantalum nitride, or molybdenum nitride may be used.

The tungsten film, the tungsten oxide film and the silicon oxide film are formed in the edge faces of the substrate by sputtering, and thus, preferably, removed by $O_2$ ashing selectively.

Next, a silicon oxynitride film as a base insulating film (with a thickness of 100 nm) is formed by PCVD, and an amorphous silicon film (with a thickness of 54 nm) containing hydrogen is laminated thereover without exposing to the air. Note that, the silicon oxynitride film is a blocking layer which prevents impurities such as alkali metal from diffusing out of the glass substrate.

A hydrogen concentration of the amorphous silicon film containing hydrogen was measured by FT-IR. As a result, Si—H was $1.06 \times 10^{22}$ (atoms/cm$^3$), Si—H$_2$ was $8.34 \times 10^{19}$ (atoms/cm$^3$), and the calculated hydrogen concentration in the composition ratio was 21.5%. Further, the hydrogen concentration was similarly calculated under changed film deposition conditions for PCVD; results of the obtained hydrogen concentrations in the composition ratio were 16.4%, 17.1%, and 19.0%.

Thereafter, the amorphous silicon film is crystallized by using a known technique (solid-phase growth, laser crystallization, crystallization using a catalyst metal, or the like), and an element using a TFT having a polysilicon film as an active layer is formed. In this embodiment, the polysilicon film is obtained by crystallization using a catalyst metal. A nickel acetate solution containing nickel of 10 ppm is applied by a spinner. Nickel elements may be applied over the entire surface by sputtering instead of spin coating. Then, a heat treatment is carried out to crystallize and form a semiconductor film having a crystal structure (here, a polysilicon layer). In this embodiment, a silicon film having a crystal structure is obtained by a heat treatment for crystallization (at 550° C. for 4 hours) after another heat treatment (at 500° C. for one hour).

The amorphous silicon film contains hydrogen. In the case of forming the polysilicon film by heating, a heat treatment of 410° C. or more is performed for crystallization, thereby diffusing hydrogen as well as forming the polysilicon film. A metal oxide film in an amorphous state is crystallized by a heat treatment of 400° C. or more, thereby obtaining a metal oxide film 301b having a crystal structure. Accordingly, the heat treatment of 410° C. or more makes it possible to form the metal oxide film having a crystal structure and diffuse hydrogen. After the heat treatment of 410° C. or more is finished, the separation inside the tungsten oxide film, or in the interface between the tungsten oxide film and the silicon oxide film, or the interface between the tungsten oxide film and the tungsten film can be achieved with relatively little force (for example, human hands, wind pressure of gas blown from a nozzle, ultrasonic waves, or the like). Note that, when a heat treatment is performed at a temperature at which a metal oxide film having a crystal structure can be obtained, the composition of the oxide metal film is changed and the thickness thereof is less to some extent. Further, the tungsten oxide film having a crystal structure has a plurality of crystal structures ($WO_2$, $WO_3$, $WO_x$ ($2<X<3$)), and $WO_3$ is changed into $WO_2$, or $WO_x$ depending on the heat treatment in its composition.

Various elements typified by a TFT (a thin film diode, a silicon-based PIN junction photoelectric conversion element, a sensor device (typically, a pressure-sensitive fingerprints sensor using polysilicon)) can be formed by using the obtained polysilicon film. In addition, the present invention can be applied to an element having a TFT that uses an amorphous silicon film as an active layer, in the case of performing the heat treatment of 410° C. or more without being crystallized.

Next, after the oxide film on the surface of the silicon film having a crystal structure is removed by dilute hydrofluoric acid or the like, irradiation of laser light (XeCl: wavelength of 308 nm) for raising a crystallization rate and repairing defects remained in crystal grains is performed in the atmosphere or in an oxygen atmosphere. Excimer laser light with a wavelength of 400 nm or less, or a second harmonic wave or a third harmonic wave of a YAG laser is used for the laser light. Here, pulsed laser light with a repetition frequency of approximately from 10 Hz to 1000 Hz is used, the pulsed laser light is condensed to from 100 mJ/cm² to 500 mJ/cm² by an optical system, and irradiation is performed with an overlap ratio of from 90% to 95%, thereby scanning the silicon film surface. Here, the irradiation of the laser light is performed in the atmosphere with a repetition frequency of 30 Hz and energy density of 470 mJ/cm². Note that, an oxide film is formed on the surface by the laser light irradiation since the irradiation is conducted in the atmosphere or in an oxygen atmosphere. Though an example of using the pulsed laser is shown here, the continuous wave laser may also be used. When crystallization of an amorphous semiconductor film is conducted, it is preferable that the second harmonic through the fourth harmonic of fundamental waves is applied by using a solid-state laser which is capable of continuously oscillating in order to obtain a crystal in large grain size. Typically, it is preferable that the second harmonic (532 nm) or the third harmonic (355 nm) of an Nd:YVO₄ laser (fundamental wave of 1064 nm) is applied. Specifically, in the case of using the continuous wave laser, laser light emitted from the continuous wave type YVO₄ laser with 10 W output is converted into harmonics by using a non-linear optical elements. Also, a method of emitting harmonics by applying crystal of YVO₄ and the non-linear optical elements into a resonator can be given. Then, preferably, the laser light is shaped so as to have a rectangular shape or an elliptical shape by an optical system on the irradiated surface, thereby irradiating an object to be treated. At this time, the energy density of approximately from 0.01 MW/cm² to 100 MW/cm² (preferably, from 0.1 MW/cm² to 10 MW/cm²) is required. The semiconductor film is moved at approximately from 10 to 2000 cm/s rate relatively corresponding to the laser light so as to irradiate the semiconductor film.

The oxide film formed by this laser light irradiation and an oxide film formed by treating the surface with ozone water for 120 seconds together make up a barrier layer that has a thickness of from 1 nm to 5 nm in total. The barrier layer is formed in order to remove nickel that is added for crystallization from the film. Though the barrier layer is formed by using ozone water in this embodiment, another method such as ultraviolet irradiation in an oxygen atmosphere or oxygen plasma treatment to oxidize the surface of the semiconductor film having the crystal structure may be used. In addition, as another method for farming the barrier layer, an oxide film having a thickness of about from 1 nm to 10 nm may be deposited by plasma CVD, sputtering, evaporation, or the like. Further, before forming the barrier layer, the oxide film formed by laser light irradiation may be removed.

On the barrier layer, an amorphous silicon film containing an argon element is formed to have a thickness of from 10 nm to 400 nm, in this embodiment, 100 nm by sputtering to serve as a gettering site. In this embodiment, the amorphous silicon film containing the argon element is formed in an atmosphere containing argon by using a silicon target. When plasma CVD is performed for forming the amorphous silicon film containing the argon element, the deposition conditions are as follows: a flow ratio of monosilane to argon (SiH₄:Ar) is controlled to be 1:99, a deposition pressure is 6.665 Pa (0.05 Torr), a RF power density during the deposition is 0.087 W/cm², and a deposition temperature is 350° C.

Thereafter, a furnace heated up to 650° C. is used for a heat treatment for 3 minutes for gettering to reduce the nickel concentration in the semiconductor film having a crystal structure. A lamp annealing apparatus may be used instead of the furnace.

Subsequently, the amorphous silicon film containing the argon element, which is the gettering site, is selectively removed by using the barrier layer as an etching stopper, and then, the barrier layer is selectively removed by dilute hydrofluoric acid. Note that there is a tendency that nickel is likely to move into a region with a high oxygen concentration in gettering, and thus, it is desirable that the barrier layer made of the oxide film is removed after gettering.

Note, that, in the case where crystallization is not performed using a catalyst element, the above described steps such as the formation of the barrier layer, the formation of the gettering site, the heat treatment for gettering, the removal of the gettering site, or the removal of the barrier layer are not necessary.

Then, after a thin oxide film is formed from ozone water on the surface of the obtained silicon film having the crystal structure (also referred to as a polysilicon film), a mask made of resist is formed, and an etching treatment is conducted thereto to obtain a desired shape, thereby forming island-like semiconductor layers separated from one another. After the formation of the semiconductor layer, the mask made of resist is removed.

Next, the oxide film is removed with etchant containing hydrofluoric acid, and at the same time, the surface of the silicon film is washed. Thereafter, an insulating film containing silicon as its main component, which serves as a gate insulating film, is formed. In this embodiment, a silicon oxynitride film (composition ratio: Si=32%, O=59%, N=7%, H=2%) is formed to have a thickness of 115 nm by plasma CVD.

Thereafter, gate electrodes are formed over a gate insulating film; the formation of a source region or a drain region attained by doping to an active layer, the formation of an interlayer insulating film, the formation of a source electrode or a gate electrode, an activation treatment, and the like are performed appropriately, thereby manufacturing top gate TFTs 203a and 203b which have a polysilicon film as an active layer. At the same time, a capacitor 206 can be formed. In addition, a semiconductor integrated circuit such as a CPU also can be formed by combining them. It should be noted that other circuits can be formed over the same substrate, although the p-channel TFT 203a and the n-channel 203b that constitutes the CMOS circuit are shown in FIGS. 2A to 2E.

A silicon nitride film or a silicon oxynitride film is formed as a protective film 204 for covering TFT. Hydrogen is preferably contained in the protective film. A silicon nitride film for covering the CPU is provided, as the protective film, for a whole surface of the substrate, thereby separating the whole surface cleanly in a separation step. The protective film 204 can also serve as a barrier layer of the light emitting element.

Here, although not shown, terminal electrodes are formed at the same time as the TFTs, and the terminal electrodes are exposed.

Next, an adhesive material that is soluble in water or alcohol is applied over the whole surface and baked. The adhesive material may be, for example, epoxy series, acrylate series, silicone series, or the like. Here, a film formed of water-soluble resin (TOAGOSEI Co., Ltd.: VL-WSHL10) 205 is spin-coated to have a thickness of 30 μm, and exposed for two minutes to be temporarily cured, then, exposed its back side to UV rays for 2.5 minutes, and then, exposed its front side for 10 minutes to be fully cured (FIG. 2A). The exposure to light is performed for 12.5 minutes in total. The water-soluble resin film serves as a leveling film, which can bond substrates to each other so that a surface of the leveling film and the substrate surface are placed in parallel in bonding the substrates later. There is a risk of unevenness that results from an electrode or from a TFT in pressure bonding when the water-soluble resin film is not used.

The adhesiveness of the metal film 201a and the metal oxide film 201b, or the adhesiveness of the metal oxide film 201b and an oxide film 202 is partly weakened for easy separation in a later step. The treatment for partly weakening the adhesiveness is carried out by partly applying laser light to the metal oxide film 201b along the region to be separated, or damaging the inside or a part of the interface of the metal oxide film 201b by applying pressure locally from outside along the region to be separated. Specifically, a hard needle such as a diamond pen may be pressed perpendicularly to the region to be separated, and moved along with the periphery thereof by applying loading. Preferably, a scriber device can be used to move with applying loading on the region with thrusting in ranging from 0.1 mm to 2 mm. It is important to carry out some steps for easy separation, that is, to prepare for the separation step. Such preparatory steps for weakening selectively (partly) the adhesiveness prevents poor separation and improve process yield.

Figure 2B:
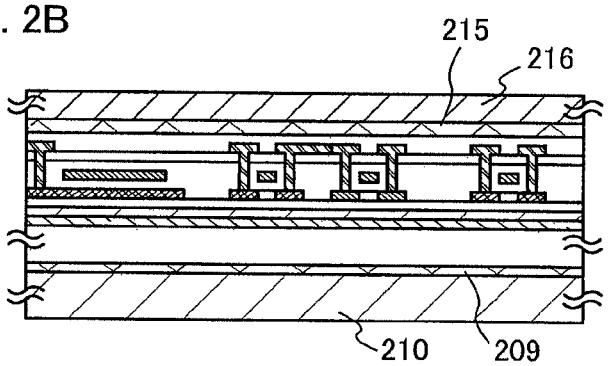

Next, a second substrate 216 is bonded to a film 205 containing water-soluble resin with a two-sided tape 215. Then, a third substrate 210 is bonded to the first substrate 200 with a two-sided tape 209 (FIG. 2B). The third substrate 210 prevents the first substrate 200 from being damaged in the later separation step. For the second substrate 216 and the third substrate 210, the substrate that has higher rigidity than that of the first substrate 200, for example, a quartz substrate or a semiconductor substrate, is preferably to be used. Note that, an adhesive material which is separated by being exposed to ultraviolet irradiation may be used instead of the two-sided tape.

Figure 2C:
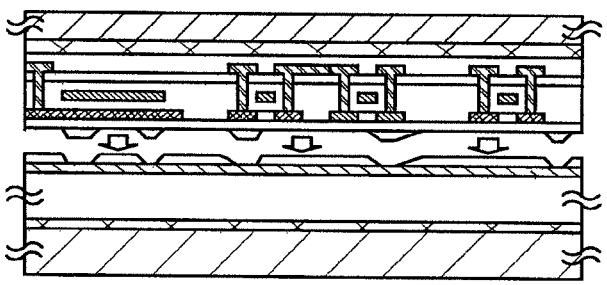

The first substrate 200 provided with the metal film 201a is separated from the region, whose adhesiveness is partly weakened, by a physical means. The first substrate 200 can be separated by relatively little force (for example, man's hand, air pressure of gas sprayed from a nozzle, ultrasonic waves, or the like). Thus, a layer to be separated formed on the silicon oxide layer 202 can be separated from the first substrate 200. FIG. 2C shows a state after the separation step. After the separation step, whole $WO_2$ remains in the first substrate, one-third of $WO_3$ remains in the first substrate, and two-thirds of $WO_3$ remains on the separated layer side. The separation tends to occur in the tungsten oxide film, particularly, in the boundary of $WO_2$ and $WO_x$, or the boundary of $WO_2$ and $WO_3$. The tungsten oxide film partly remains in the separated layer, however, the tungsten film is transparent, so that the tungsten film may not be necessarily removed. In this embodiment, the tungsten film is removed.

By applying the separation method described above, a TFT having high electric characteristics, which can be obtained over a glass substrate, (typified by field effect mobility) can be transferred to a plastic substrate, as it is.

Figure 2D:
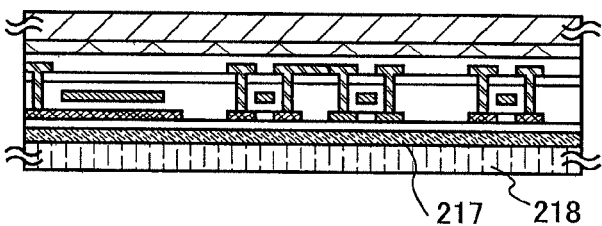

Next, a fourth substrate 218 is bonded to the oxide layer 202 (and the separated layer) with an adhesive material 217 (FIG. 2D). It is important for the adhesive agent 217 that the adhesiveness of the fourth substrate 218 and the oxide layer 202 (and the separated layer) is stronger than that of the second substrate 216 and the separated layer by the two-sided tape 215.

A plastic substrate (ARTON made of norbornene resin with a polar group, manufactured by JSR corporation) is used for the fourth substrate 218. The plastic substrate can be formed of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyallylate (PAR), polybutylene terephthalate (PBT), or polyimide.

As the adhesive material 217, various types of curing adhesive material, for example, a reaction-curing adhesive material, a heat-curing adhesive material, a photo-curing adhesive material such as a UV-curing adhesive material, or an anaerobic adhesive material etc. can be utilized.

Figure 2E:
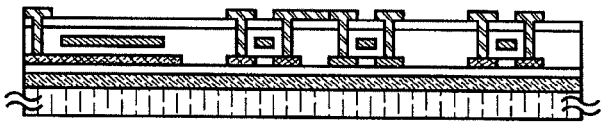

The second substrate 216 is separated from the two-sided tape 215. Then, the two-sided tape 215 is removed. And then, the water-soluble resin 205 is dissolved in water and removed (FIG. 2E).

According to the above-described steps, the first separated layer that is transferred to the plastic substrate 218 is obtained.

Subsequently, a second layer to be separated is provided.

An element is formed over a glass substrate (a first substrate 300). A metal layer 301a is formed, here, a tungsten film is formed as the metal layer 301a to have a thickness of from 10 nm to 200 nm, preferably, from 50 nm to 75 nm, as the first separated layer. Further, the oxide layer 302, a silicon oxide layer in this instance, is laminated to have a thickness of from 150 nm to 200 nm without being exposed to the air.

Next, a silicon oxynitride film as a base insulating film (with a thickness of 100 nm) is formed by PCVD, and an amorphous silicon film (with a thickness of 54 nm) containing hydrogen is laminated thereover without exposing to the air.

Thereafter, the amorphous silicon film is crystallized by using a known technique (solid-phase growth, laser crystallization, crystallization using a catalyst metal, or the like), and an element using a TFT having a polysilicon film as an active layer is formed. A gate insulating film and a gate electrode are formed; the formation of a source region or a drain region attained by doping to the active layer, the formation of an interlayer insulating film, the formation of a source electrode or a gate electrode, an activation treatment, and the like are performed appropriately, thereby manufacturing a top gate TFT 303 which has a polysilicon film as an active layer. Note that, a switching TFT or a driver circuit for driving a pixel portion is also formed over the same substrate, although only a current control TFT in the pixel portion is shown in FIGS. 3A to 3J.

Next, a layer containing an organic compound (hereinafter, an EL layer) is interposed between a pair of electrodes (an anode and a cathode). Then, a first electrode for forming a light emitting device that can achieve fluorescence or phosphorescence by applying electric field to the pair of electrodes is formed. Here, the first electrode 304 that can serve as an anode or a cathode is formed of a metal film having a large work function (Cr, Pt, W, or the like), or a transparent conductive film (indium tin oxide alloy (ITO), indium oxide zinc oxide alloy ($In_2O_3$—ZnO), zinc oxide (ZnO), or the like). An example of forming the first electrode 304 for serving as an anode is described.

In the case where the source electrode or the drain electrode of a TFT serves as a first electrode, or a first electrode is formed separately to be in contact with the source region or the drain region, the TFT includes the first electrode.

A partition wall 305a (referred to as a bank, a barrier, a mound) is formed on each end of the first electrode (anode) to surround the periphery of the first electrode. To improve the coverage, the upper edge portion or the bottom edge portion of the partition wall is formed to have a curved surface having curvature. For example, in the case where a positive type photosensitive acrylic is used as a material for the partition wall, it is preferable that only the upper edge portion of the partition wall is formed to have a curved surface having radius of curvature (from 0.2 μm to 3 μm). Either a negative type resin that is insoluble in etchant due to light or a positive type resin that is dissoluble in etchant due to light can be used as the partition wall 305a.

Figure 3A:
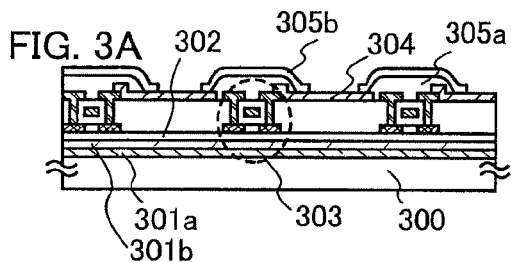
FIGS. 3A to 3J show manufacturing steps, respectively (Embodiment 1)

Further, in the case of laminating a plurality of organic resins, there is a risk that a part of the plural organic resins is melted or the adhesiveness gets too high, during application or baking. Therefore, in the case of using organic resin as a material for the partition wall, the partition wall 305a is preferably covered with an inorganic insulating film (a $SiN_x$ film, a $SiN_xO_y$ film, an $AlN_x$ film, or an $AlN_xO_y$ film) in order to make it easy to remove water-soluble resin after applying it over the surface in a later step. The inorganic insulating film serves as a part of the partition wall 305b (FIG. 3A).

Figure 3B:
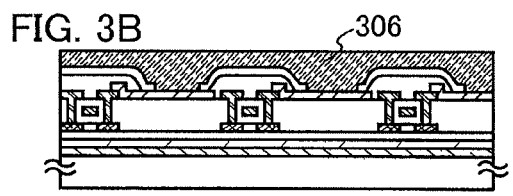

Next, an adhesive material that is soluble in water or alcohol is applied over the whole surface and baked. The adhesive material may be, for example, epoxy series, acrylate series, silicone series, or the like. Here, a film formed of water-soluble resin (TOAGOSEI Co., Ltd.: VL-WSHL10) 306 is spin-coated to have a thickness of 30 μm, exposed for two minutes to be temporarily cured, and then, its back side is exposed to UV rays for 2.5 minutes, and then, its front side is exposed to UV rays for 10 minutes to be fully cured (FIG. 3B). The exposure to light is performed for 12.5 minutes in total.

The adhesiveness of the metal film 301a and the metal oxide film 301b, or the adhesiveness of the metal oxide film 301b and an oxide film 302 is partly weakened for easy separation in a later step.

Figure 3C:
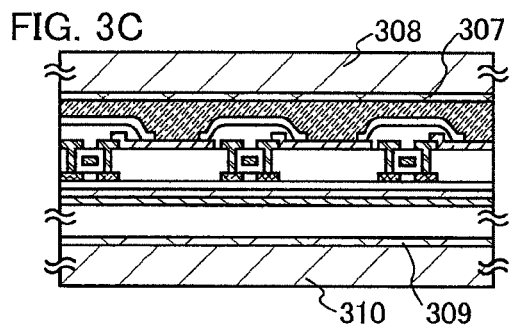
Figure 3D:
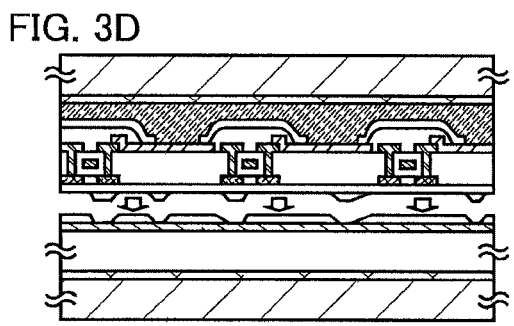

Next, a second substrate 308 is bonded to the film 306 formed of water-soluble resin with a two-sided tape 307. Then, a third substrate 310 is pasted to the first substrate 300 with a two-sided tape 309 (FIG. 3C). The third substrate 310 prevents the first substrate 300 from being damaged in the later separation step. For the second substrate 308 and the third substrate 310, the substrate that has higher rigidity than that of the first substrate 300, for example, a quartz substrate or a semiconductor substrate, is preferably used. Note that, an adhesive material which is separated by being exposed to UV irradiation may be used instead of the two-sided tape.

The first substrate 300 provided with the metal film 301a is separated from the region, whose adhesiveness is partly weakened, by a physical means. The first substrate 300 can be separated by relatively little force (for example, man's hand, air pressure of gas sprayed from a nozzle, ultrasonic waves, or the like). Thus, a layer to be separated formed over the silicon oxide layer 302 can be separated from the first substrate 300. The tungsten oxide film partly remains in the separated layer, however, the tungsten film is transparent, so that the tungsten film may not be necessarily removed. In this embodiment, the tungsten film is removed.

Figure 3E:
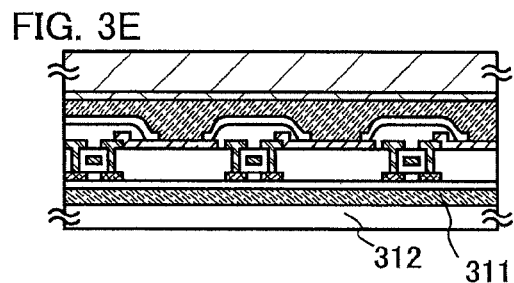

Next, a fourth substrate 312 is bonded to the oxide layer 302 (and the separated layer) with an adhesive material 311 (FIG. 3E). It is important for the adhesive material 311 that the adhesiveness of a fourth substrate 312 and the oxide layer 302 (and the separated layer) is stronger than that of the second substrate 308 and the separated layer by the two-sided tape 307.

A plastic substrate (ARTON made of norbornene resin with a polar group, manufactured by JSR corporation) is used for the fourth substrate 312. The plastic substrate can be formed of polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyallylate (PAR), polybutylene terephthalate (PBT), or polyimide.

As the adhesive material 311, various types of curing adhesive materials, for example, a reaction-curing adhesive material, a heat-curing adhesive material, a photo-curing adhesive material such as a UV-curing adhesive material, or an anaerobic adhesive material etc. is utilized.

Figure 3F:
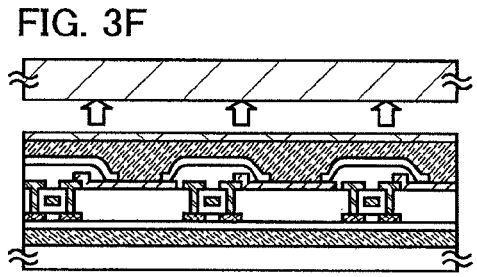

The second substrate 308 is separated from the two-sided tape 307 (FIG. 3F).

Figure 3G:
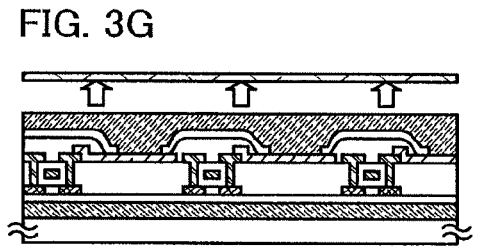

Then, the two-sided tape 307 is removed (FIG. 3G).

Figure 3H:
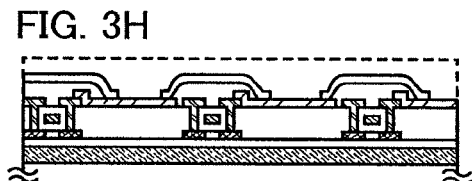

And then, the water-soluble resin 306 is dissolved in water and removed (FIG. 3H). If residue of the water-soluble resin is left on the first electrode 304, it may cause the deterioration of the device. Consequently, it is preferable that the surface of the first electrode 304 be rinsed or treated in $O_2$ plasma.

If necessary, the surface of the first electrode 304 is rubbed and washed by using a porous sponge (typically, a sponge of PVA (polyvinyl alcohol) or nylon) soaked in a surfactant (weak alkaline).

Immediately prior to forming a layer containing an organic compound (EL layer) 313, the substrate is heated in a vacuum for removing moisture absorbed in the whole substrate that is provided with a TFT and a partition wall. Moreover, the first electrode may be exposed to ultraviolet irradiation immediately prior to forming the layer containing the organic compound.

The layer containing the organic compound (EL layer) 313 is formed selectively over the first electrode (anode) by evaporation using an evaporation mask or ink-jetting. As the layer containing the organic compound 313, a high molecular weight material, a low molecular weight material, an inorganic material, a mixed layer formed of the above materials, a layer formed by dispersing the above materials, or a lamination layer formed by stacking appropriate combination of the above materials can be used.

Figure 3I:
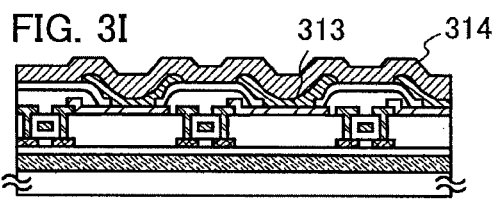

A second electrode (cathode) 314 is formed over the layer containing the organic compound (FIG. 3I). A thin film, which has a thickness of being transparent to light, formed of a small work function material (Al, Ag, Li, Ca, or alloy such as MgAg, MgIn, AlLi, or inorganic materials such as $CaF_2$, or CaN) is utilized for the cathode 314. If necessary, a protective layer is formed for covering the second electrode by sputtering or evaporation. The protective layer may contain a silicon nitride film, silicon oxide film, a silicon nitride oxide film (SiNO film: a ratio of N to O composition is N>O)), or silicon oxynitride (SiON film: a ratio of N to O composition is N<O), or a thin film containing carbon as its main component (for example, DLC film, or CN film) that are formed by sputtering or CVD.

According to the above-described steps, the second separated layer that is transferred to the plastic substrate 312 is obtained.

The thus obtained separated layers are bonded with each other. Here, the same plastic substrates (ARTON manufactured by JSR corporation) are used to prevent a warp by conforming the thermal expansion coefficient. A sealing material (not shown) containing a gap material for maintaining a space between a pair of substrates is applied to the substrate 218 that serves as a sealing plate. Conduction of terminal electrodes that are provided for each of the two separated layers is obtained by conductive particles contained in the sealing material. For the conduction of the terminal electrodes, a conductive paste may be used separately from the sealing material.

Then, a few drops of a sealing material with a low viscosity are applied and the substrate 218 and the active matrix substrate 312 are bonded without air bubbles mixed into the sealing material using a bonding device. It is preferable to bond the substrates in vacuum so as not to generate bubbles.

Figure 3J:
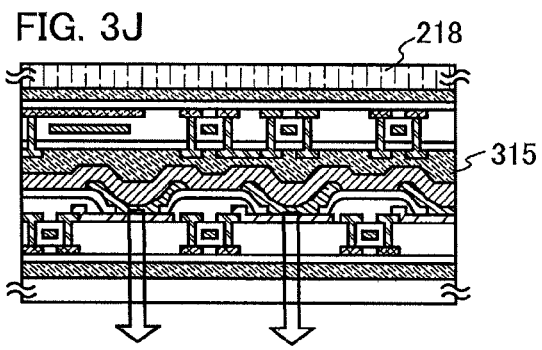

Moreover, the method for applying a few drops of the sealing material with a low viscosity is also effective for bonding a pair of flexible plastic substrates together. Sealing is performed in a manner where a light emitting region provided on an active matrix substrate is surrounded by sealing patterns provided for a sealing substrate by this bonding step. Further, sealing is performed in a manner where a space surrounded by the sealing material is filled with an adhesive material 315 formed from an organic resin (FIG. 3J).

In the above steps, a light emitting device provided with a CPU, a TFT and a light emitting element can be manufactured with the plastic substrates 312 and 218 serving as support media. The light emitting device can be thin, lightweight, and flexible since the support media are plastic substrates. FIGS. 3A to 3J show a bottom emission type light emitting display device in which light of the light emitting element passes through the plastic substrate 312. FIGS. 3A to 3J are cross-sectional views in which a display portion and a CMOS circuit that constitutes the CPU are overlapped. However, the present invention is not limited thereto, and the CPU may be arranged not to overlap with the display portion.

Here, an example of a light emitting device having a bottom emission structure is shown in FIGS. 6A and 6B.

Note that, FIG. 6A is a top view of the light emitting device and FIG. 6B is a cross-sectional view of FIG. 6A taken along the line A-A'. Reference numeral 1210 denotes a substrate; 1201 indicated by the dotted line denotes a source signal line driver circuit; 1202 denotes a pixel portion; 1203 denotes gate signal line driver circuits; 1204 denotes a sealing plate; 1206 indicated by the chained line denotes an integrated circuit (e.g., CPU).

1205 is a sealing material containing conductive particles 1220 for connecting a connection wiring 1225 with the integrated circuit 1206. The inner space sealed by the sealing material 1205 is filled with an adhesive material (typically, a transparent resin) 1207. A gap material for keeping a space between the sealing plate 1204 and the substrate 1210 may be included in the sealing material 1205.

In addition, the inner space sealed by the sealing material 1205 may be filled with an inert gas (typically, nitride). A desiccant is provided for the inner space to remove the trace quantity of moisture in the inner space surrounded by the sealing material 1205 so as to dry the inner space enough.

Note that, reference numeral 1208 denotes a wiring for transmitting signals inputted to the source signal line driver circuit 1201 and the gate signal line driver circuit 1203, and the wiring receives video signals and clock signals from an FPC (flexible printed circuit) 1209 serving as an external input terminal.

Next, a cross-sectional structure is explained with reference to FIG. 6B. Although a driver circuit and a pixel portion are formed over the substrate 1210, the source signal line driver circuit 1201 shown as the driver circuit in FIG. 6B. The source signal line driver circuit 1201 is formed from a CMOS circuit that is a combination of an n-channel TFT 1223 and a p-channel TFT 1224.

The pixel portion 1202 is formed from a plurality of pixels each of which includes a switching TFT 1211, a current control TFT 1212, and a first electrode (anode) 1213 formed from a transparent conductive film that is electrically connected to a drain of the current control TFT 1212.

In this embodiment, the first electrode 1213 is formed so that a part thereof is to be overlapped with a connecting electrode so as to be electrically connected to a drain region of the TFT by the connecting electrode. It is preferable that the first electrode 1213 includes a conductive film that has transparency and a large work function (for example, an indium tin oxide alloy (ITO), an indium oxide-zinc oxide alloy ($In_2O_3$—ZnO), zinc oxide (ZnO), or the like).

An insulator 1214 (referred to as a bank, partition wall, barrier, mound or the like) is formed to cover each end portion of the first electrode (anode) 1213. To improve the coverage, the upper edge portion or the lower edge portion of the insulator 1214 is formed to have a curved surface having a curvature. In addition, the insulator 1214 may be covered with a protective film formed of an aluminum nitride film, an aluminum nitride oxide film, a thin film containing carbon as its main component, or a silicon nitride film.

A layer containing an organic compound 1215 is selectively formed over the first electrode (anode) 1213 by evaporation of an organic compound material while introducing monosilane gas. Further, a second electrode (cathode) 1216 is formed over the layer containing the organic compound 1215. A small work function material (for example Al, Ag, Li, Ca, alloys such as, MgAg, MgIn, AlLi, inorganic compounds such as $CaF_2$, or CaN) may be used as a material for forming the cathode. Thus, a light emitting element 1218 including the first electrode (anode) 1213, the layer containing the organic compound 1215, and the second electrode (cathode) 1216, is manufactured. The light emitting element 1218 emits light in the direction indicated by the arrow in FIG. 6B. The light emitting element 1218 in this embodiment is a type of the one that can achieve monochrome emission of R (red), G (green), or B (blue). Full color emission can be achieved by three light emitting elements in which each layer containing the organic compound that can achieve R, G, and B emission is formed selectively.

Further, a protective laminated layer 1217 is foamed in order to seal the light emitting element 1218. The protective laminated layer 1217 is a laminate of a first inorganic insulating film, a stress relaxation film, and a second inorganic insulating film.

Further, the sealing plate 1204 is bonded by the sealing material 1205 and the adhesive material 1207 in vacuum or in an inert gas atmosphere, in order to seal the light emitting element 1218. It is preferable to use an epoxy resin as a material for the sealing material 1205. It is also preferable that the sealing material 1205 and the adhesive material 1207 prevent moisture or oxygen from entering thereinto as much as possible.

A layer including the pixel portion 1202 and the driver circuits 1201 and 1203 is bonded to the substrate 1210 with an adhesive layer 1222 therebetween. A layer including the integrated circuit 1206 is bonded to the sealing plate 1204 with an adhesive layer 1221 therebetween. A display device having less warp can be provided by using the plastic substrates having the same thermal expansion coefficient as the substrate 1210 and the sealing plate 1204. When the display device is bended, the pair of substrates are bended together in a similar manner, and thus, lowering of the adhesiveness of the substrates can be prevented.

This embodiment can be freely combined with Embodiment Modes 1 to 3.

Embodiment 2

This embodiment shows an example of manufacturing a light emitting device (having a top emission structure) provided with a light emitting element that has a layer containing an organic compound as a light emitting layer, over a glass substrate.

Compared to a bottom emission structure, the top emission structure requires few material layers through which light generated in the layer containing the organic compound pass, thereby reducing stray light between material layers having different reflective index.

The pixel portion is made up of a plurality of pixels each of which comprises a switching TFT, a current control TFT and a first electrode (anode) which is electrically connected to a drain of the current control TFT. The current control TFT may either be an n-channel TFT or a p-channel TFT, but when it is to be connected to the anode, it is preferably be a p-channel TFT. The TFTs can be manufactured with reference to Embodiment 1. As in Embodiment 1, before the TFTs are manufactured, a laminate of a tungsten film, a tungsten oxide film, and a silicon oxide film is formed.

Since it is constituted such that the first electrode is directly connected to the drain of the TFT, it is preferable that a lower layer of the first electrode be a material layer which can have an ohmic contact with the drain containing silicon, while a top layer thereof which contacts the layer containing the organic compound is preferably a material layer which has a large work function. For example, a three-layer structure which includes a titanium nitride film, a film containing aluminum as a main component, and a titanium nitride film, can have a low resistance of wiring and a favorable ohmic contact, and also, can function as an anode. Further, as the first electrode, a single layer of at least one film selected from a titanium nitride film, a chromium film, a tungsten film, a zinc film, a platinum film and the like, or a laminate of three layers or more may be used.

An insulator (referred to as a bank, a partition wall, a barrier, a mound or the like) is formed to cover each end portion of the first electrode (anode). The insulator may be formed by either an organic resin film or an insulating film containing silicon. In this embodiment, as for the insulator, an insulator is formed to have a tapered shape by using a positive photosensitive acrylic resin film.

To improve the coverage, the upper edge portion or the bottom edge portion of the insulator is fixated to have a curved surface having curvature. For example, in the case where a positive type photosensitive acrylic is used as a material for the insulator, it is preferable that only the upper edge portion of the insulator is formed to have a curved surface having radius of curvature (from 0.2 μm to 3 μm). Either a negative type resin that is insoluble in etchant due to light or a positive type resin that is dissoluble in etchant due to light can be used as the insulator.

At the stage of forming the insulator, a separation step from the substrate and a transfer step to a plastic substrate are performed as in Embodiment 1.

A layer containing an organic compound is selectively formed over the first electrode (anode) by evaporation using an evaporation mask or ink-jetting. Further, a second electrode (cathode) is formed over the layer containing the organic compound. As for the cathode, a material having a small work function (for example Al, Ag, Li, Ca, alloys thereof, that is, MgAg, MgIn, AlLi, $CaF_2$, or CaN) may be used. In this embodiment, as for the second electrode (cathode), a thin metal film which has a small thickness is formed, and a transparent conductive film (for example, an indium oxide-tin oxide alloy (ITO), an indium oxide-zinc oxide alloy ($In_2O_3$—ZnO), zinc oxide (ZnO) or the like) is laminated thereover in order to allow light to pass through. Note that, the transparent conductive film is formed in order to reduce the electric resistance. Then, a light emitting element including the first electrode (anode), the layer containing the organic compound, and the second electrode (cathode) is manufactured. In the case where light emitting element is emitting white light, a color filter including a colored layer and a light shielding layer (BM) may be provided to obtain a full-color display.

Further, when layers each containing an organic compound which can obtain R, G, and B luminescence respectively, are selectively formed, a full-color display can be obtained without using a color filter.

A sealing plate including a semiconductor integrated circuit is bonded, as in Embodiment 1, after the second electrode (cathode) is formed. Note that, since this embodiment describes a top emission type, it is preferable that the semiconductor integrated circuit and the pixel portion are designed so as not to be overlapped with each other and the space between the sealing plate and the cathode is filled with a transparent resin.

In the case of using a transparent conductive film (such as ITO) instead of a metal film typified by titanium nitride, a dual-emission type display device can be obtained, which enables a display by making light pass through the sealing plate and a display by making the light pass through the plastic substrate provided with the light emitting element. Similarly in this case, it is preferable that the semiconductor integrated circuit and the pixel portion are designed so as not to be overlapped with each other, and the space between the sealing plate and the cathode is preferably filled with a transparent resin.

This embodiment can be freely combined with Embodiment Modes 1 to 3 or Embodiment 1.

Embodiment 3

This embodiment shows an example of a liquid crystal display device hereinafter.

According to Embodiment 1, a layer to be separated including a pixel TFT is formed over a laminate of a tungsten film, a tungsten oxide film, and a silicon oxide film over a glass substrate. A driver circuit may be formed in the same step. An n-channel TFT is used as the pixel TFT, and a transparent conductive film is used as a pixel electrode. The pixel TFT may be formed by a known method.

In addition, column spacers containing an inorganic material may be provided at a regular interval to keep the thickness of a liquid crystal layer.

Subsequently, as in Embodiment 1, the layer to be separated including the pixel TFT is separated from the glass substrate and transferred to a plastic substrate. Thus, an active matrix plastic substrate is manufactured.

According to Embodiment 1, a layer to be separated including a CPU is formed over a laminate of a tungsten film, a tungsten oxide film, a silicon oxide film over a glass substrate. An opposite electrode made of a transparent conductive film is formed besides the step of manufacturing the CPU.

Then, as in Embodiment 1, the layer to be separated including the CPU is separated from the glass substrate and transferred to a plastic substrate. It should be noted that an optical film is used for the plastic substrate. In the liquid crystal display device, optical films such as a color filter, a polarization plate, a retardation film are used. In this embodiment, the separated layer is transferred to a color filter in which a colored layer is patterned over the plastic substrate. Note that, the CPU is designed so as not to be arranged in a region to be a display portion (a region where the colored layer is arranged in matrix).

An orientation film is applied to each of faces provided with the separated layers, and then, a rubbing treatment is performed on the faces. A spherical spacer is sprayed if necessary.

A sealing material is applied to one of the faces. The sealing material is arranged so as to surround at least the pixel portion. A liquid crystal material is dropped into the region surrounded by the sealing material. Appropriate doses of liquid crystals are dropped in vacuum, and as it is, the plastic substrates are preferably bonded with each other in vacuum. The terminal electrode of the CPU provided for the color filter and the opposite electrode are preferably made conductive with the terminal electrode provided for the plastic substrate by conductive particles contained in the sealing material. A conductive paste may be used for the conduction, besides the sealing material.

According to the above-described steps, a liquid crystal display device is completed, in which the liquid crystal is sandwiched by the plastic substrate provided with the pixel electrode and the color filter.

This embodiment can be freely combined with Embodiment Modes 1 to 3 or Embodiment 1 or 2.

Embodiment 4

Figure 8A:
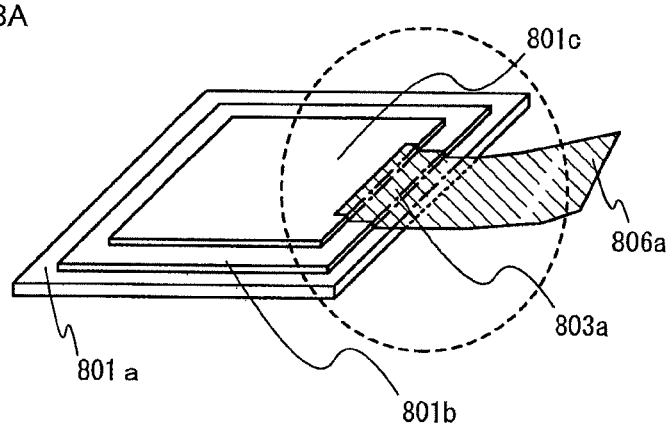
FIGS. 8A and 8B are an oblique perspective view and a top view of a bottom emission type light emitting device, respectively (Embodiment 4)
Figure 8B:
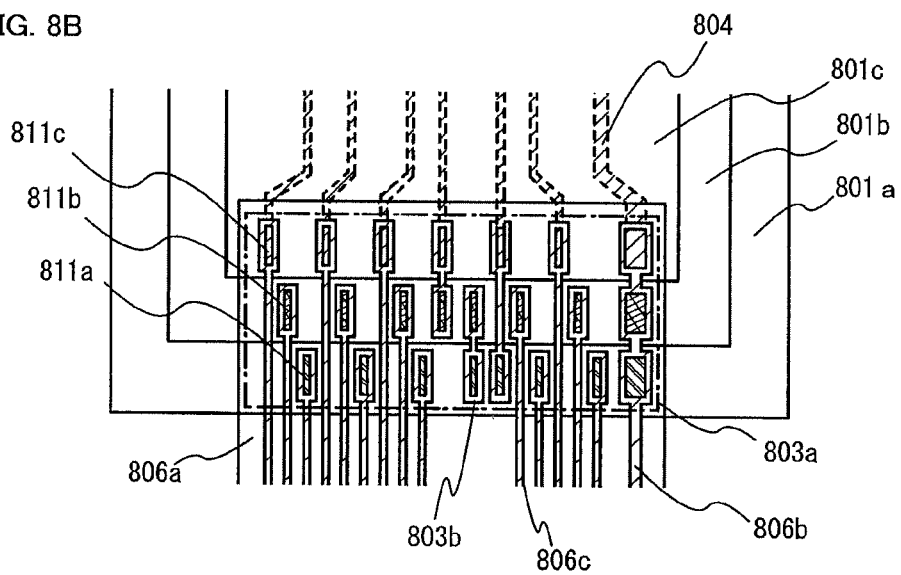

A semiconductor module manufactured according to Embodiment Mode 3 is described in this embodiment with reference to FIGS. 8A and 8B.

FIG. 8A is an oblique perspective view, and a second separated layer 801b and a third separated layer 801c are formed respectively over a first separated layer 801a, in such a way that edge faces thereof are disposed in a staircase pattern. An anisotropic conductive film 803a and an FPC 806a are bonded in accordance with the step difference in FIG. 8A. FIG. 8B is an enlarged top view of a region surrounded by the dotted line FIG. 8A.

A wiring 803b is provided for a surface of the anisotropic conductive film 803a as shown in FIG. 8B, and is electrically connected to a terminal electrode provided for each of the separated layers. In FIG. 8B, a first terminal electrode 811a is formed to be exposed in the surface of the first separated layer 801a. Similarly, a second terminal electrode 811b is formed to be exposed in a surface of the second separated layer 801b, and a third terminal electrode 811c is formed to be exposed in a surface of the third separated layer 801c. In FIG. 8B, a wiring 804 that is formed on the third separated layer 801c is shown by a dotted line, and the wiring 804 is connected to an element (not shown) included in the third separated layer 801c.

The FPC 806a is a film in which wirings 806b and 806c are formed over an insulating film and which is exposed to a laminate processing. The wiring 806c is a wiring for leading out the second terminal electrode 811b provided for the second separated layer 801b. The wiring 806b that is provided for the FPC is a common wiring to be electrically connected with all terminal electrodes 811a to 811c.

The first separated layer 801a, the second separated layer 801b, and the third separated layer 801c include various elements (such as a thin film transistor, a light emitting element including a layer containing an organic compound, an element having a liquid crystal, a memory element, a thin film diode, a silicon-based PIN junction photoelectric conversion element, or a silicon resistance element), and is separated by a separation method shown in Embodiment Mode 1.

When various elements are formed over the same substrate, there is a risk of lowering the yield since a design rule or a process temperature has more limitations. In this embodiment, a module is formed by forming elements over different heat-resistance substrates and then, separating the heat-resistance substrates therefrom, and laminating and bonding the substrates together.

The first separated layer 801a is preferably bonded to a support medium (not shown). A plastic substrate (a resin substrate) or a glass substrate may be used as the support medium.

An example of a cross-sectional view of the module in FIGS. 8A and 8B corresponds to that in FIG. 7A.

This embodiment can be freely combined with Embodiment Modes 1 to 3 or Embodiments 1 to 3.

Embodiment 5

Various modules (an active matrix EL module, a passive matrix EL module, a liquid crystal display device and an active matrix EC module) can be completed by implementing the present invention. Namely, all of the electronics into which the various modules are built is completed by implementing the present invention.

Following can be given as such electronics: video cameras; digital cameras; head mounted displays (goggle type displays); car navigation systems; projectors; car stereos; personal computers; portable information terminals (mobile computers, mobile phones or electronic books etc.) etc. Examples of these are shown in FIGS. 9A to 9E and 10A to 10C.

Figures 9A, 9B:
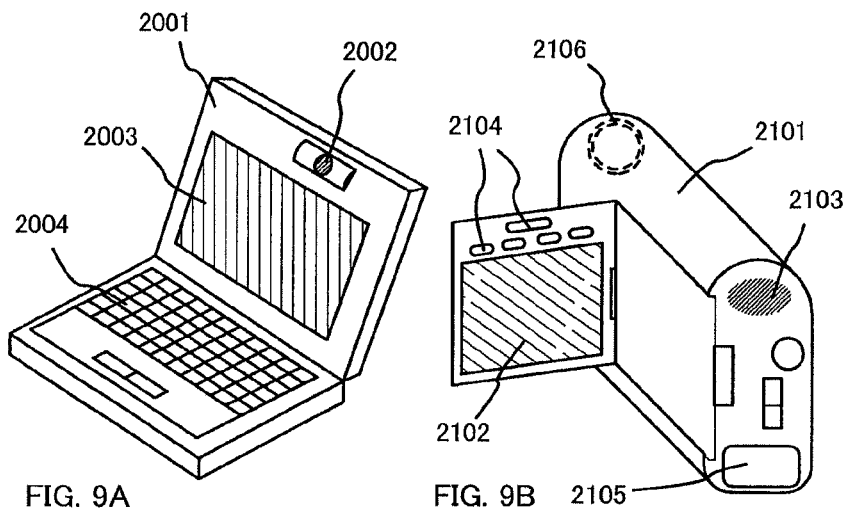
FIGS. 9A to 9E are examples of electronic devices, respectively (Embodiment 5)

FIG. 9A is a personal computer including a main body 2001, an image input section 2002, a display portion 2003, a keyboard 2004, and the like. The personal computer can be more light-weight according to the present invention.

FIG. 9B is a video camera including a main body 2101, a display portion 2102, a voice input section 2103, operation switches 2104, a battery 2105, an image receiving section 2106, and the like. The video camera can be more light-weight according to the present invention.

Figures 9C, 9D:
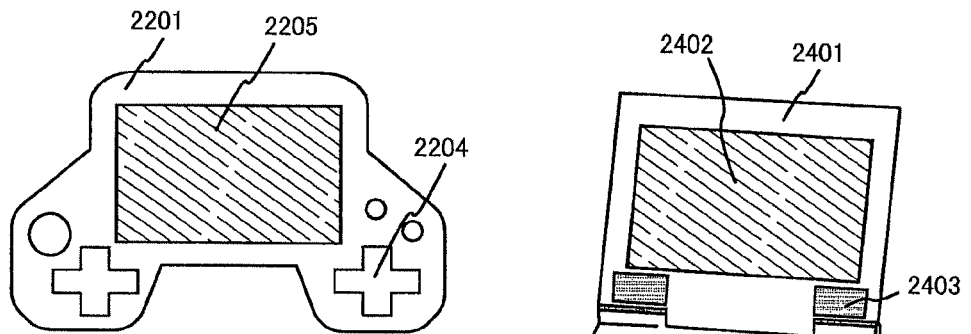

FIG. 9C is a game machine including a main body 2201, operation switches 2204, a display portion 2205, and the like.

FIG. 9D is a player using a recording medium in which a program is recorded (hereinafter referred to as a recording medium), which includes a main body 2401, a display portion 2402, a speaker section 2403, a recording medium 2404, and operation switches 2405, and the like. This player uses DVD (digital versatile disc), CD, etc. as the recording medium, and makes it possible to perform music appreciation, film appreciation, games and use for Internet.

Figure 9E:
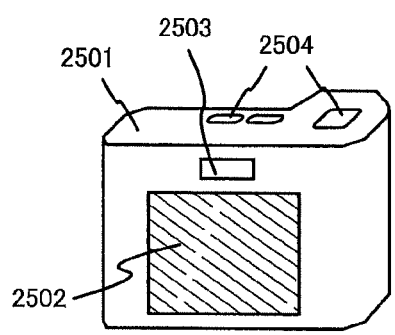

FIG. 9E is a digital camera including a main body 2501, a display portion 2502, a view finder 2503, operation switches 2504, an image receiving section (not shown), and the like. The digital camera can be more light-weight according to the present invention.

Figure 10A:
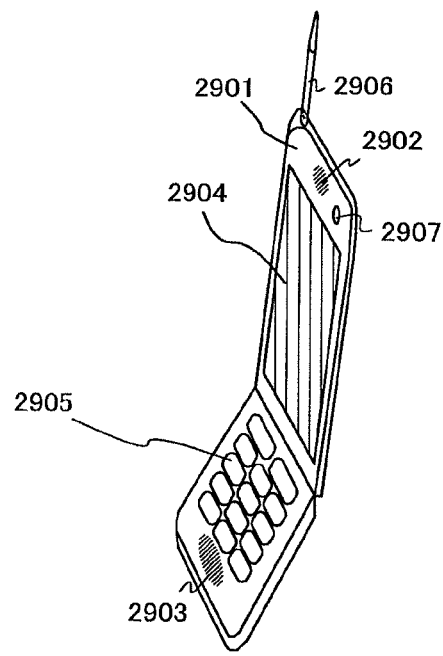
FIGS. 10A to 10C are examples of electronic devices, respectively (Embodiment 5).

FIG. 10A is a mobile phone including a main body 2901, a voice output section 2902, a voice input section 2903, a display portion 2904, operation switches 2905, an antenna 2906, an image input section (CCD, image sensor, etc.) 2907 and the like.

Figure 10B:
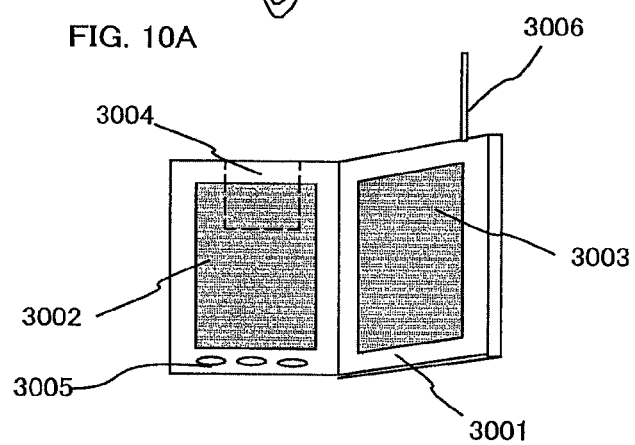

FIG. 10B is a portable book (electronic book) including a main body 3001, display portions 3002 and 3003, a recording medium 3004, operation switches 3005, an antenna 3006, and the like. The portable book can be more light-weight according to the present invention.

Figure 10C:
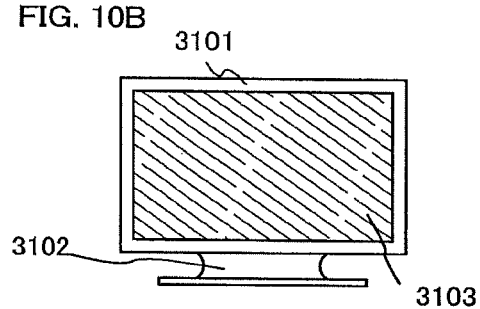

FIG. 10C is a display unit including a main body 3101, a supporting section 3102, a display portion 3103, and the like.

In addition, the display unit shown in FIG. 10C has small and medium-sized or large-sized screen, for example a size of from 5 inches to 20 inches. Further, for the sake of manufacturing the display portion with such sizes, it is preferable to mass-produce by gang printing by using a substrate with one meter on a side.

As described above, the applicable range of the present invention is extremely large, and the present invention can be applied to electronics in various areas. Note that, the electronics in this embodiment can be achieved by utilizing any combination of constitutions in Embodiment Mode 1 or 2, and Embodiments 1 to 4.

This application is based on Japanese Patent Application serial no. 2003-069742 filed in Japan Patent Office on 14 Mar. 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor device comprising:
a first substrate;
a first adhesive layer over the first substrate;
a pixel portion and a driver circuit over the first adhesive layer, the pixel portion comprising:
a first transistor over the first adhesive layer;
a second transistor over the first adhesive layer;
a first electrode over the first transistor;
an EL layer over the first electrode; and
a second electrode over the EL layer;
a second substrate provided with a circuit comprising a third transistor;
a second adhesive layer between the circuit and the second substrate; and
a sealing material surrounding the pixel portion and the driver circuit,
wherein the circuit overlaps with the driver circuit, and
wherein the pixel portion, the driver circuit, the sealing material, and the circuit are provided between the first adhesive layer and the second adhesive layer.

2. The semiconductor device according to claim 1, wherein each of the first substrate and the second substrate is a plastic substrate.

3. An electronic device having the semiconductor device according to claim 1, wherein the electronic device is selected from the group consisting of a video camera, a digital camera, a head mounted display, a car navigation system, a car stereo, a personal computer, a mobile computer, a mobile phone and an electric book.

4. A semiconductor device according to claim 1, wherein the first substrate and the second substrate are capable of bending.

5. A semiconductor device comprising:
a first substrate;
a first adhesive layer over the first substrate;
a pixel portion comprising a light-emitting element over the first adhesive layer;
a driver circuit over the first adhesive layer;
a second substrate provided with a circuit;
a second adhesive layer between the circuit and the second substrate; and
a sealing material surrounding the pixel portion and the driver circuit,
wherein the circuit overlaps with the driver circuit, and
wherein the pixel portion, the driver circuit, the sealing material, and the circuit are provided between the first adhesive layer and the second adhesive layer.

6. A semiconductor device according to claim 5, wherein the first substrate comprises an organic resin material.

7. A semiconductor device according to claim 5,
wherein the circuit comprises:
a central processing unit, the central processing unit comprising:
a control unit; and
an arithmetic unit; and
a memory unit, and
wherein the central processing unit comprises a plurality of transistors.

8. A semiconductor device according to claim 5, wherein the circuit comprises a thin film diode.

9. A semiconductor device according to claim 5, wherein the circuit comprises a silicon-based PIN junction photoelectric conversion element.

10. A semiconductor device according to claim 5, wherein the circuit comprises a silicon resistance element.

11. A semiconductor device according to claim 5, wherein the first substrate and the second substrate are capable of bending.

12. A semiconductor device comprising:
a first substrate;
a first adhesive layer over the first substrate;
a pixel portion comprising a light-emitting element over the first adhesive layer;
a driver circuit over the first adhesive layer;
a second substrate provided with a circuit;
a sealing material comprising a conductive particle, the sealing material surrounding the pixel portion and the driver circuit;
a second adhesive layer between the circuit and the second substrate;
a connection wiring over the first substrate; and
an FPC electrically connected to the circuit through the conductive particle and the connection wiring,
wherein the circuit overlaps with the driver circuit, and
wherein the pixel portion, the driver circuit, the sealing material, and the circuit are provided between the first adhesive layer and the second adhesive layer.

13. A semiconductor device according to claim 12, wherein the first substrate comprises an organic resin material.

14. A semiconductor device according to claim 12,
wherein the circuit comprises:
a central processing unit, the central processing unit comprising:
a control unit; and
an arithmetic unit; and
a memory unit, and
wherein the central processing unit comprises a plurality of transistors.

15. A semiconductor device according to claim 12, wherein the circuit comprises a thin film diode.

16. A semiconductor device according to claim 12, wherein the circuit comprises a silicon-based PIN junction photoelectric conversion element.

17. A semiconductor device according to claim 12, wherein the circuit comprises a silicon resistance element.

18. A semiconductor device according to claim 12, wherein the FPC is provided over the first substrate.

19. A semiconductor device according to claim 12, wherein the first substrate and the second substrate are capable of bending.

20. A semiconductor device comprising:
a first adhesive layer;
a pixel portion comprising a light-emitting element over the first adhesive layer;

a driver circuit over the first adhesive layer;
a circuit over the driver circuit;
a second adhesive layer over the circuit; and
a sealing material surrounding the pixel portion and the driver circuit;
wherein the circuit overlaps with the driver circuit, and
wherein the pixel portion, the driver circuit, the sealing material, and the circuit are provided between the first adhesive layer and the second adhesive layer.

21. A semiconductor device according to claim 20, wherein the circuit comprises:
   a central processing unit, the central processing unit comprising:
      a control unit; and
      an arithmetic unit; and
   a memory unit, and
wherein the central processing unit comprises a plurality of transistors.

22. A semiconductor device according to claim 20, wherein the circuit comprises a thin film diode.

23. A semiconductor device according to claim 20, wherein the circuit comprises a silicon-based PIN junction photoelectric conversion element.

24. A semiconductor device according to claim 20, wherein the circuit comprises a silicon resistance element.

* * * * *